United States Patent [19]
Nishikawa

[11] Patent Number: 5,805,604
[45] Date of Patent: Sep. 8, 1998

[54] APPARATUS AND METHOD FOR READING AND WRITING DATA

[75] Inventor: Meisei Nishikawa, Tokyo, Japan

[73] Assignee: Kabushiki Kaisha Toshiba, Kanagawa-ken, Japan

[21] Appl. No.: 624,768

[22] Filed: Mar. 27, 1996

[30] Foreign Application Priority Data

Mar. 29, 1995 [JP] Japan .................................. 7-071368

[51] Int. Cl.$^6$ .................................................. G06F 11/00
[52] U.S. Cl. ............................................. 371/2.1; 371/40.1
[58] Field of Search .................................. 371/10.3, 2.1, 371/2.2, 37.5, 38.1, 40.1, 44, 48; 360/32

[56] References Cited

U.S. PATENT DOCUMENTS 4,937,686 6/1990 Arai et al. .................................. 360/32
5,014,274 5/1991 Higurashi et al. ...................... 371/40.1
5,420,872 5/1995 Hyodo et al. ............................. 371/31

*Primary Examiner*—Vincent P. Canney
*Attorney, Agent, or Firm*—Finnegan, Henderson, Farabow, Garrett & Dunner, L.L.P.

[57] ABSTRACT

A memory circuit having a plurality of regions. A first rearranging circuit, controlled by a control circuit, rearranges plural bits of data having different significances when a first of the regions includes a defective portion and a first one of the plural bits is to be written into the first region, so that a second of the plural bits having lower significance than that of the first bit is written into another one of the plurality of regions. A second rearranging circuit, controlled by the control circuit, rearranges the plural bits of data read out from the memory circuit so that the first and second bits are returned to correct positions.

78 Claims, 11 Drawing Sheets

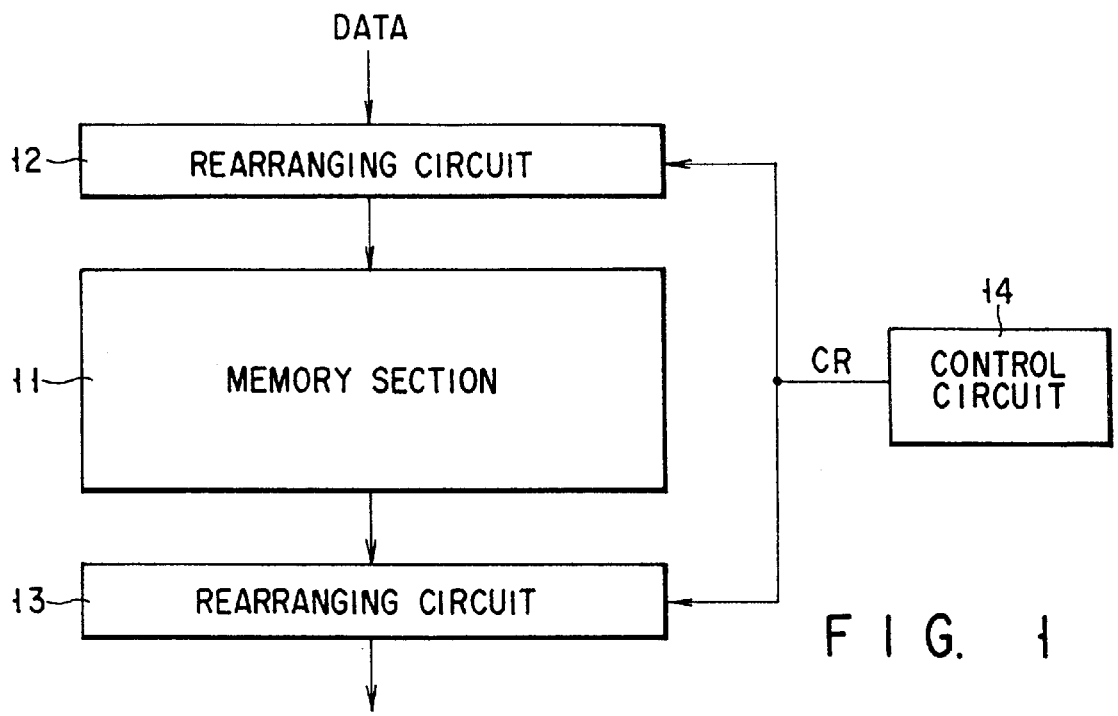
F I G. 1
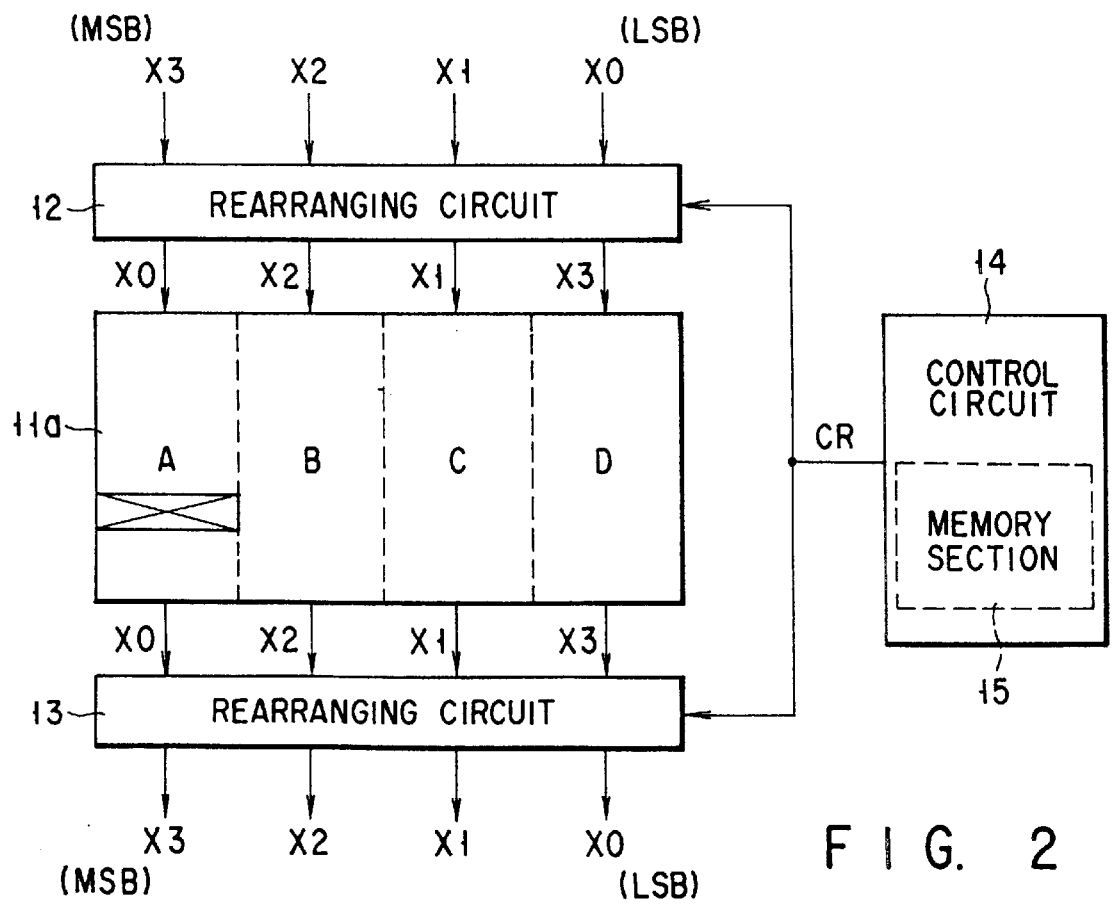
F I G. 2

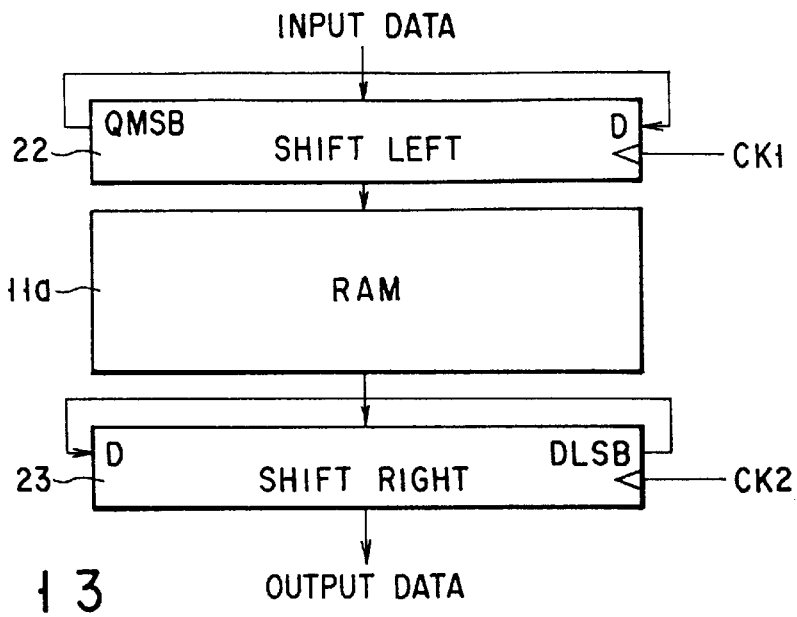
F I G. 1 3
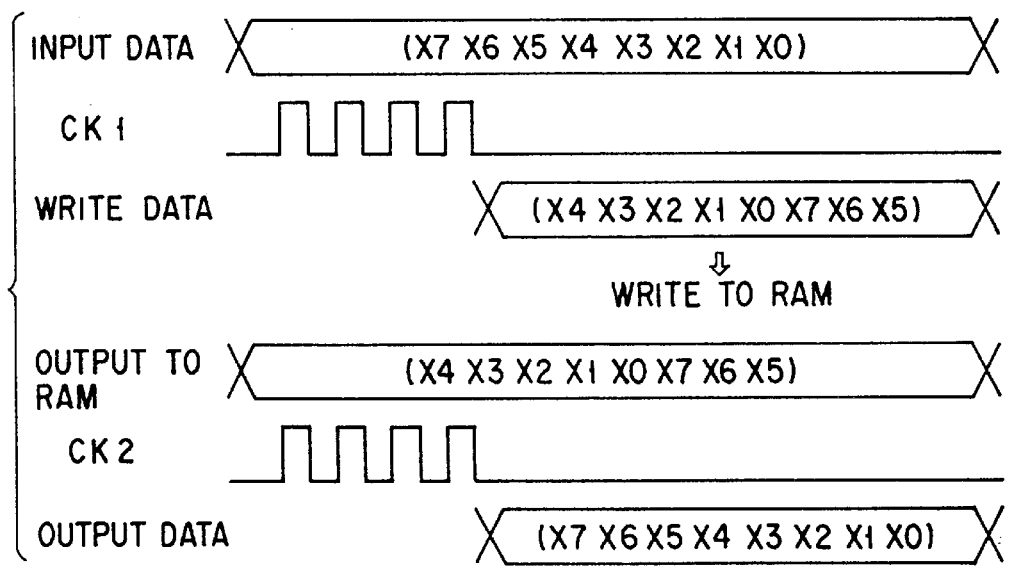
F I G. 1 4
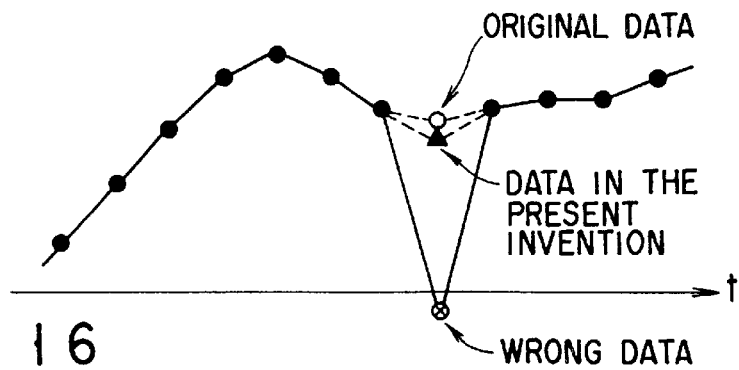
F I G. 1 6

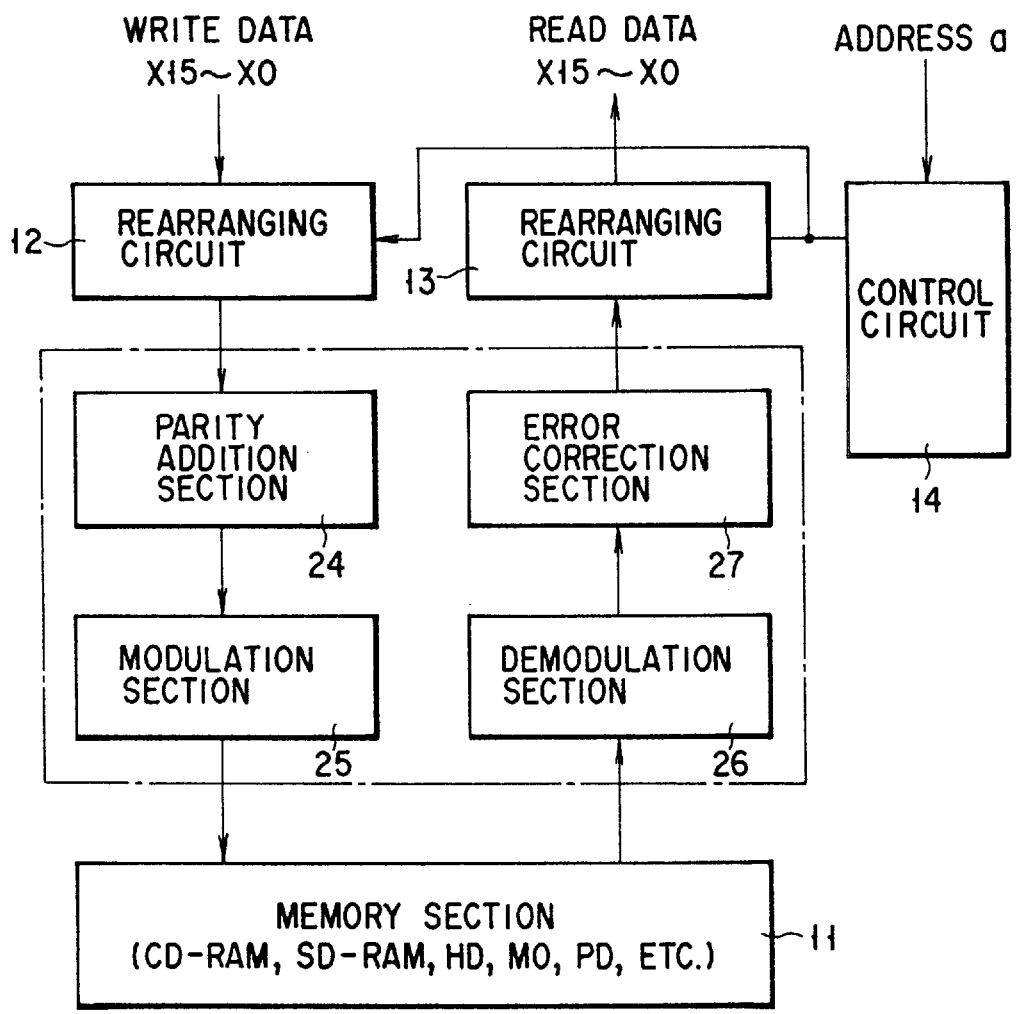
F I G. 15

APPARATUS AND METHOD FOR READING AND WRITING DATA

BACKGROUND OF THE INVENTION

1. Field of the Invention

The present invention relates to media for storing data.

2. Description of the Related Art

Conventionally, a semiconductor memory includes a redundancy circuit. This redundancy circuit has a function to replace memory cells having defects with spare memory cells. Therefore, even if there are defects in a portion of memory cells, data error can be prevented.

However, there is a restriction in numbers (columns or rows) of spare memory cells from the standpoint of cost and relief efficiency. Therefore, if the number of memory cells having defects exceeds the number (columns or rows) of spare memory cells, the excess parts cannot be relieved.

Furthermore, a hard disk, when it has a defect cell, conventionally records information by avoiding the sector including this defect cell. Accordingly, the memory capacity of the hard disk is substantially reduced.

Thus, conventionally in semiconductor memory, there is a disadvantage that if the number of memory cells having defects exceeds the number (columns or rows) of spare memory cells, the excess parts cannot be relieved. Furthermore, in a hard disk, there is a disadvantage that since it avoids the sector including the defect cell to record information, the memory capacity of the hard disk is substantially reduced.

SUMMARY OF THE INVENTION

It is an object of the present invention to use a storage medium having a defect portion without avoiding to use the defect portion.

In accordance with the present invention, the foregoing objects, among others, are achieved by providing a memory device for storing data composed of plural bits having different significances, comprising memory means having a plurality of regions, rearranging means for rearranging the plural bits when a first one of the regions includes a defective portion and a first of the plural bits is to be written into the first region, and control means for controlling the rearranging means so that a second of the plural bits having a lower significance than that of the first bit is written into the first region and the first bit is written into another one of the plurality of regions.

There has also been provided, in accordance with yet another aspect of the present invention, a memory device for storing data composed of plural bits having different significances, comprising memory means having a plurality of portions divided into regions, address means for providing an address designating the portion of the memory means where the plural bits are to be stored, rearranging means for rearranging the plural bits when a first one of the regions includes a defective portion and the address designates the defective portion for writing a first of the plural bits, and control means for controlling the rearranging means so that a second of the plural bits having a lower significance than that of the first bit is written into the first region and the first bit is written into another one of the regions.

There has also been provided, in accordance with yet another aspect of the present invention, a memory device for storing data composed of plural bits having different significances, comprising memory means having a plurality of regions, rearranging means for rearranging the plural bits when a first one of the regions includes a defective portion and a first bit group of the plural bits composed of continuing bit sequence is to be written into the first region, and control means for controlling the rearranging means so that a second bit group of the plural bits composed of a continuing bit sequence and having a lower significance than that of respective bits of the first bit group is written into the first region and the first bit group is written into another one of the plurality of regions.

There has also been provided, in accordance with yet another aspect of the present invention, a memory device for storing data composed of plural bits having different significances, comprising memory means having a plurality of portions divided into regions, address means for providing address designating the portion of the memory means where the plural bits are to be stored, rearranging means for rearranging the plural bits when a first one of the regions includes a defective potions and the address designates the defective portion for writing a first bit group of the plural bits composed of a continuing bit sequence, and control means for controlling the rearranging means so that a second bit group of the plural bits composed of a continuing bit sequence having a lower significance than that of respective bits of the first bit group is written into the first region and the first bit group is written into another one of the regions.

There has also been provided, in accordance with yet another aspect of the present invention, an apparatus for use with a storage medium for storing data composed of plural bits having different significances, the storage medium having a plurality of regions a first region of which including a defective portion, comprising rearranging means for rearranging the plural bits when a first one of the plural bits is to be written into the first region, and control means for controlling the rearranging means so that a second of the plural bit having a lower significance than that of the first bit is written into the first region and the first bit is written into another one of the plurality of regions.

There has also been provided, in accordance with yet another aspect of the present invention, an apparatus for use with a storage medium for storing data composed of plural bits having different significances, the storage medium having a plurality of portions divided into regions a first region of which including a defective portion, comprising address means for providing an address designating the portion of the storage medium where the plural bits are to be stored, rearranging means for rearranging the plural bits when the address designates the defective portion for writing a first of the plural bits, and control means for controlling the rearranging means so that a second of the plural bits having a lower significance than that of the first bit is written into the first region and the first bit is written into another one of the regions.

There has also been provided, in accordance with yet another aspect of the present invention, an apparatus for use with a storage medium for storing data composed of plural bits having different significances, the storage medium having a plurality of regions a first region of which including a defective portion, comprising rearranging means for rearranging the plural bits when a first bit group of the plural bits composed of continuing bit sequence is to be written into the first region, and control means for controlling the rearranging means so that a second bit group of the plural bits composed of a continuing bit sequence and having a lower significance than that of respective bits of the first bit group is written into the first region and the first bit group is written into another one of the plurality of regions.

There has also been provided, in accordance with yet another aspect of the present invention, an apparatus for use with a storage medium for storing data composed of plural bits having different significances, the storage medium having a plurality of portions divided into regions a first region of which including a defective portion, comprising address means for providing address designating the portion of the storage medium where the plural bits are to be stored, rearranging means for rearranging the plural bits when the address designates the defective portion for writing a first bit group of the plural bits composed of a continuing bit sequence, and control means for controlling the rearranging means so that a second bit group of the plural bits composed of a continuing bit sequence having a lower significance than that of respective bits of the first bit group is written into the first region and the first bit group is written into another one of the regions.

There has also been provided, in accordance with yet another aspect of the present invention, a method of reading and writing data to a storage medium having a plurality of regions, the data composed of plural bits having different significances, comprising steps of rearranging the plural bits when a first one of the regions includes a defective portion and a first one of the plural bits is to be written into the first region, so that a second one of the plural bits having a lower significance than that of the first bit is written into the first region and the first bit is written into another one of the plurality of regions, and rearranging the plural bits read out from the storage medium so that the first and second bits are returned to correct positions.

There has also been provided, in accordance with yet another aspect of the present invention, a method of reading and writing data to a storage medium having a plurality of portions divided into regions, the data composed of plural bits having different significances, comprising steps of providing an address designating the portion in the storage medium, where the plural bits are to be written, rearranging the plural bits when a first one of the regions includes a defective portion and the address designates the defective portion for writing a first one of the plural bits, so that a second one of the plural bits having a lower significance than that of the first bit is written into the first region and the first bit is written into another one of the plurality of regions, and rearranging the plural bits read out from the storage medium so that the first and second bits are returned to correct positions.

There has also been provided, in accordance with yet another aspect of the present invention, a method of reading and writing data to a storage medium having a plurality of regions, the data composed of plural bits having different significances, comprising steps of rearranging the plural bits when a first one of the regions includes a defective portion and a first bit group of the plural bits composed of continuing bit sequence is to be written into the first region, so that a second bit group of the plural bits composed of continuing bit sequence having a lower significance than that of the first bit group is written into the first region and the first bit group is written into another one of the plurality of regions, and rearranging the plural bits read out from the storage medium so that the first and second bit groups are returned to correct positions.

There has also been provided, in accordance with yet another aspect of the present invention, a method of reading and writing data to a storage medium having a plurality of portions divided into regions, the data composed of plural bits having different significances, comprising steps of providing an address designating the portion in the storage medium, where the plural bits are to be written, rearranging the plural bits when a first one of the regions includes a defective portion and the address designates the defective portion for writing a first bit group of the plural bits composed of continuing bit sequence, so that a second bit group of the plural bits composed of continuing bit sequence having a lower significance than that of the first bit group is written into the first region and the first bit group is written into another one of the plurality of regions, and rearranging the plural bits read out from the storage medium so that the first and second bit groups are returned to correct positions.

There has also been provided, in accordance with yet another aspect of the present invention, an apparatus for reading plural bits of data from a storage medium, the plural bits having a predetermined sequence and different significances and being stored in the storage medium in a rearranging sequence, so that at least one bit of greater significance is stored in a non-defective portion of the storage medium and at least one bit of lesser significance is stored in a defective portion of the storage medium, comprising means for reading out the plural bits from the storage medium having the defective portion, and means for rearranging the plural bits to the predetermined sequence the bits had prior to storage in the storage medium having the defective portion.

There has also been provided, in accordance with yet another aspect of the present invention, a method of reading plural bits of data from a storage medium, the plural bits having a predetermined sequence and different significances and being stored in the storage medium in a rearranging sequence, so that at least one bit of greater significance is stored in a non-defective portion of the storage medium and at least one bit of lesser significance is stored in a defective portion of the storage medium, comprising the steps of reading out the plural bits from the storage medium having the defective portion, and rearranging the plural bits to the predetermined sequence the bits had prior to storage in the storage medium having the defective portion.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which:

FIG. 1 is a block diagram illustrating a memory device according to the present invention;

FIG. 2 is a block diagram showing a read-write device and a memory device related to a first embodiment of the present invention;

FIG. 13 is a view showing an example in which shift registers are used as the rearranging circuit;

FIG. 14 is a view showing the action of the shift register of FIG. 13;

FIG. 15 is a block diagram showing the read-write device and the memory device related to a fifth embodiment of the present invention; and FIG. 16 is a view showing the difference between data in the present invention.

DETAILED DESCRIPTION OF THE PREFERRED EMBODIMENTS

Figure 3:
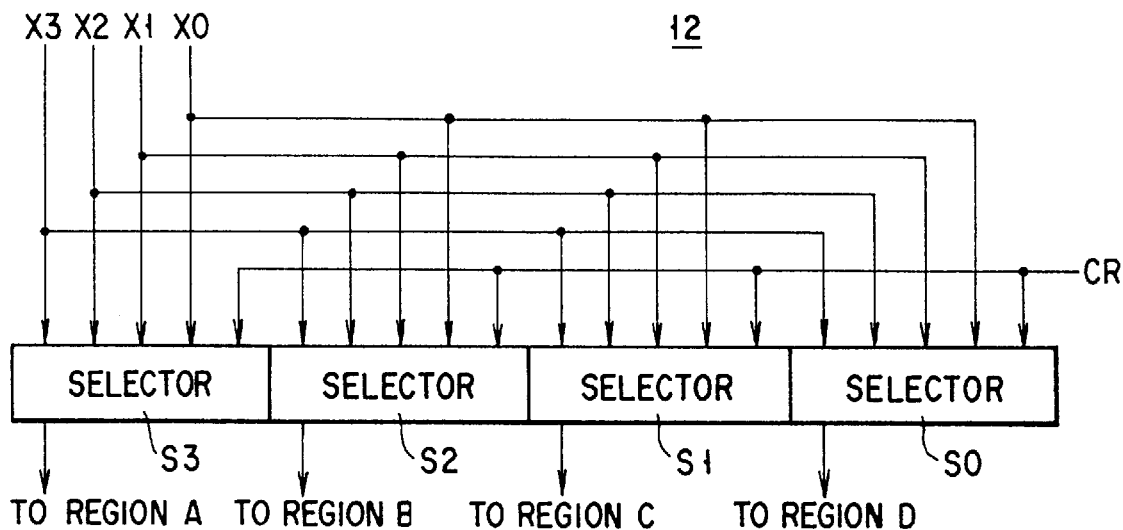
FIG. 3 is a view showing the structure of a rearranging circuit of FIG. 2.

The memory device of the present invention will now be described in detail with reference to the accompanying drawings.

FIG. 1 shows a basic structure of a memory device according to the present invention.

A memory section 11 is composed of a semiconductor memory, such as ROM and RAM, an HD (hard disk), FD (floppy disk), CD-RAM, SD-RAM, MO (magneto-optical disk), PD (phase change rewrite-type disk), MT (magnetic tape) or the like.

A rearranging circuit 12 has a function to rearrange respective bits representing image data, music data and the like which having different significances and store them in the memory section 11. The rearranging circuit 13 has a function to rearrange respective bits representing image data, music data and the like read out from the memory section 11 and output them. A control circuit 14 gives the rearrangement control signal CR to the rearranging circuits 12 and 13 and controls the rearrangement of respective bits by the rearranging circuits 12 and 13.

In the machines affecting the human sense of sight or hearing, such as audio and video, in general, there is a case that even if one bit or plural bits of image data or music data are incorrect, the error is not recognized by the human sense of sight or hearing. Namely, it can be said that a certain degree of error may be allowed with regard to image data, music data and the like related to the human sense of sight or hearing.

Embodiments in accordance with the present invention are effective to reduce the effect due to defects of a memory cell or a sector to a minimum, not by relieving a memory cell having a defect or avoiding a section having a defect, but by rearranging the data, in a memory circuit for storing image data and music data relating to the human sense of sight or hearing.

Namely, when there is a defect in a part of a memory section 11, such as RAM, ROM, ED, FD, CD-RAM, SD-RAM, MO, PD and MT, the rearranging circuit 12 rearranges respective bits representing image data, music data and the like so that a LSB (least significant bit) is stored in the defect region.

Therefore, when there is a defect in a region where an LSB is originally stored, there is no need to rearrange respective bits, but when there is a defect in a bit other than the LSB, for example, a region where a MSB (most significant bit) is stored, respective bits are rearranged so that the LSB is stored in the defect region.

FIG. 2 shows a memory device relating to the first embodiment of the present invention.

This memory device relates to a semiconductor memory (RAM). In addition, for example, with respect to digital audio signal, the music data is typically represented by 16 bits, but in the following description, a 4 bits case will be described for ease of description.

First, the structure of this semiconductor memory will be explained.

RAM 11a has a plurality of memory cells formed in rows and columns. RAM 11a is divided into four regions in the direction of, for example, rows, to constitute regions A to D. The rearranging circuit 12 rearranges respective bits representing image data, music data and the like having different significances to store them in RAM 11a. The rearranging circuit 13 rearranges respective bits representing image data, music data and the like read out from RAM 11a and outputs them.

The control circuit 14 includes a memory section 15 (for example, ROM). The control circuit 14 gives a rearrangement control signal CR to the rearranging circuits 12 and 13 based on the data stored in the memory section 15, to control the rearrangement of respective bits in the rearranging circuits 12 and 13.

Figure 4:
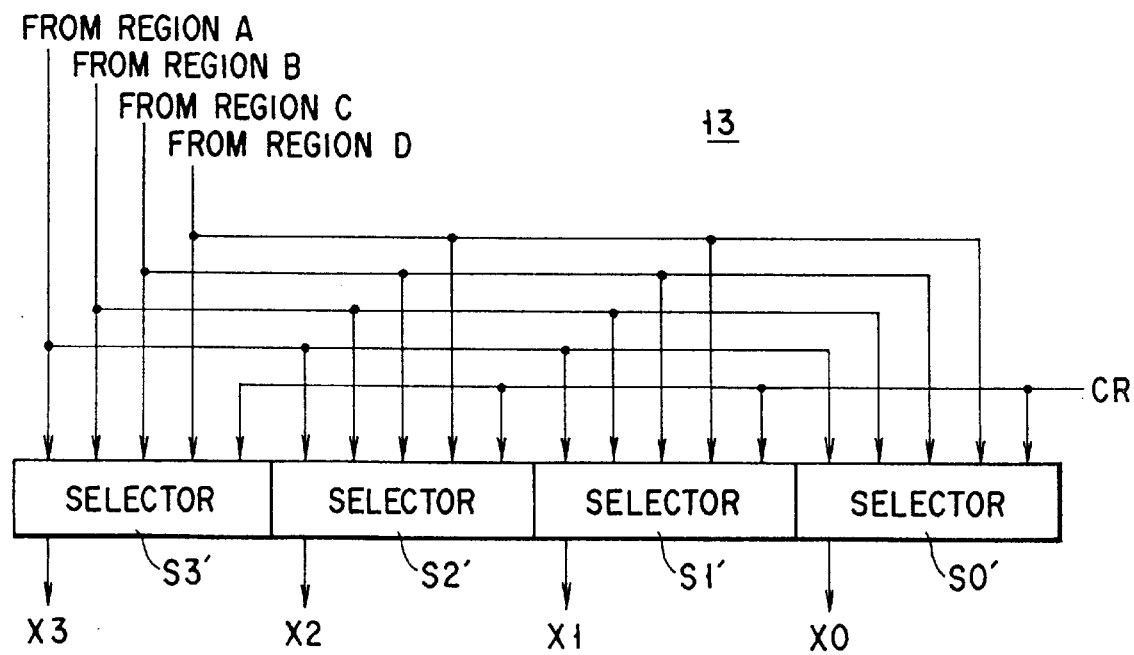
FIG. 4 is a view showing the structure of the rearranging circuit of FIG. 2.

FIG. 3 shows one example of the rearranging circuit 12 of FIG. 2. FIG. 4 shows one example of the rearranging circuit 13 of FIG. 2.

The rearranging circuit 12 is composed of four selectors S0 to S3, and the rearranging circuit 13 is composed of four selectors S0' to S3'.

To respective selectors S3 to S0 of the rearranging circuit 12 are connected to receive the rearrangement control signal CR and four-bit data X3 to X0 representing image data, music data and the like. Respective selectors S3 to S0 select a predetermined one-bit data, as shown in Table 1, based on the rearrangement control signal CR, and outputs this selected one-bit data.

To respective selectors S3' to S0' of the rearranging circuit 13 are connected to receive the rearrangement control signal CR and four-bit output data X3 to X0 of the memory section. Respective selectors S3' to S0' select a predetermined one-bit data, as shown in Table 2, based on the rearrangement control signal CR, and outputs this selected one-bit data.

TABLE 1

| Control signal (error pattern E3,E2,E1,E0) | 0000 | 0001 | 0010 | 0100 | 1000 |
|---|---|---|---|---|---|
| Input Signal to be selected | X3,X2,X1,X0 | X3,X2,X1,X0 | X3,X2,X1,X0 | X3,X2,X1,X0 | X3,X2,X1,X0 |
| Selector S3 | X3 | X3 | X3 | X3 | X0 |
| Selector S2 | X2 | X2 | X2 | X0 | X2 |
| Selector S1 | X1 | X1 | X0 | X1 | X1 |
| Selector S0 | X0 | X0 | X1 | X2 | X3 |
| Output | X3,X2,X1,X0 | X3,X2,X1,X0 | X3,X2,X0,X1 | X3,X0,X1,X2 | X0,X2,X1,X3 |

TABLE 2

| Control signal (error pattern E3,E2,E1,E0) | 0000 | 0001 | 0010 | 0100 | 1000 |
|---|---|---|---|---|---|
| Input Signal to be selected | X3,X2,X1,X0 | X3,X2,X1,X0 | X3,X2,X0,X1 | X3,X0,X1,X2 | X0,X2,X1,X3 |
| Selector S3' | X3 | X3 | X3 | X3 | X3 |
| Selector S2' | X2 | X2 | X2 | X2 | X2 |
| Selector S1' | X1 | X1 | X1 | X1 | X1 |
| Selector S0' | X0 | X0 | X0 | X0 | X0 |
| Output | X3,X2,X1,X0 | X3,X2,X1,X0 | X3,X2,X1,X0 | X3,X2,X1,X0 | X3,X2,X1,X0 |

Next, the action of this semiconductor memory will be described.

First, at the time of production or at the time of initiation of the system, the write test and the read test of the data in the semiconductor memory are conducted, to examine whether a memory cell having such defects that image data or music data cannot be recorded or is recorded wrong exists in RAM 11a or not.

Furthermore, when a memory cell having a defect exists in RAM 11a, it is confirmed in which region of RAM 11a the memory cell having the defect exists. The information regarding the defect of memory cells is stored in the memory section 15 of the control circuit 14.

The control circuit 14 gives the rearrangement control signal CR to the rearranging circuit 12 based on the information of the memory section 15, when the image data or the music data is stored. This rearrangement control signal CR is represented by, for example, four bits, and determines the arrangement of respective bits of the image data or the music data.

Respective selectors S3 to S0 of the rearranging circuit 12 select, upon receipt of this control signal CR, a predetermined one bit among four bits representing the image data or the music data, as shown in Table 1, and outputs it.

At this time, when the memory cell has a defect in a region where a bit having large significance, such as the MSB, is stored, the control circuit 14 gives to the rearranging circuit 12 the control signal CR having a form causing the LSB to be stored in the region.

For example, when there exists a memory cell having a defect in region A of RAM 11a, the control circuit 14 gives 1, 0, 0, 0 as the control signal CR to respective selectors S3 to S0 of the rearranging circuit 12. As a result, selector S3 selects bit X0, selector S2 selects bit X2, selector S1 selects bit X1, and selector S0 selects bit X3.

Therefore, the four bits of image data or music data are rearranged from X3 (MSB), X2, X1, X0 (LSB) to X0 (LSB), X2, X1, X3 (MSB). Namely, bit X0 is written in the memory cell of region A.

Furthermore, when there exists a memory cell having a defect in region A of RAM 11a, the control circuit 14 gives 1, 0, 0, 0 as a control signal CR to respective selectors S3' to S0' of the rearranging circuit 13. As a result, selector S3' selects bit X3, selector S2 selects bit X2, selector S1 selects bit X1, and selector S0 selects bit X0.

Therefore, the four bits of image data or music data output from RAM 11a are rearranged from X0 (LSB), X2, X1, X3 (MSB) to X3 (MSB), X2, X1, X0 (LSB).

In addition, the control signal CR is also an error pattern showing the region having a defect. Namely, it shows that in the case of 0, 0, 0, 0, there is no defect, in the case of 1, 0, 0, 0, there is a defect in region A, in the case of 0, 1, 0, 0, there is a defect in region B, in the case of 0, 0, 1, 0, there is a defect in region C, and in the case of 0, 0, 0, 1, there is a defect in region D.

Figure 5:
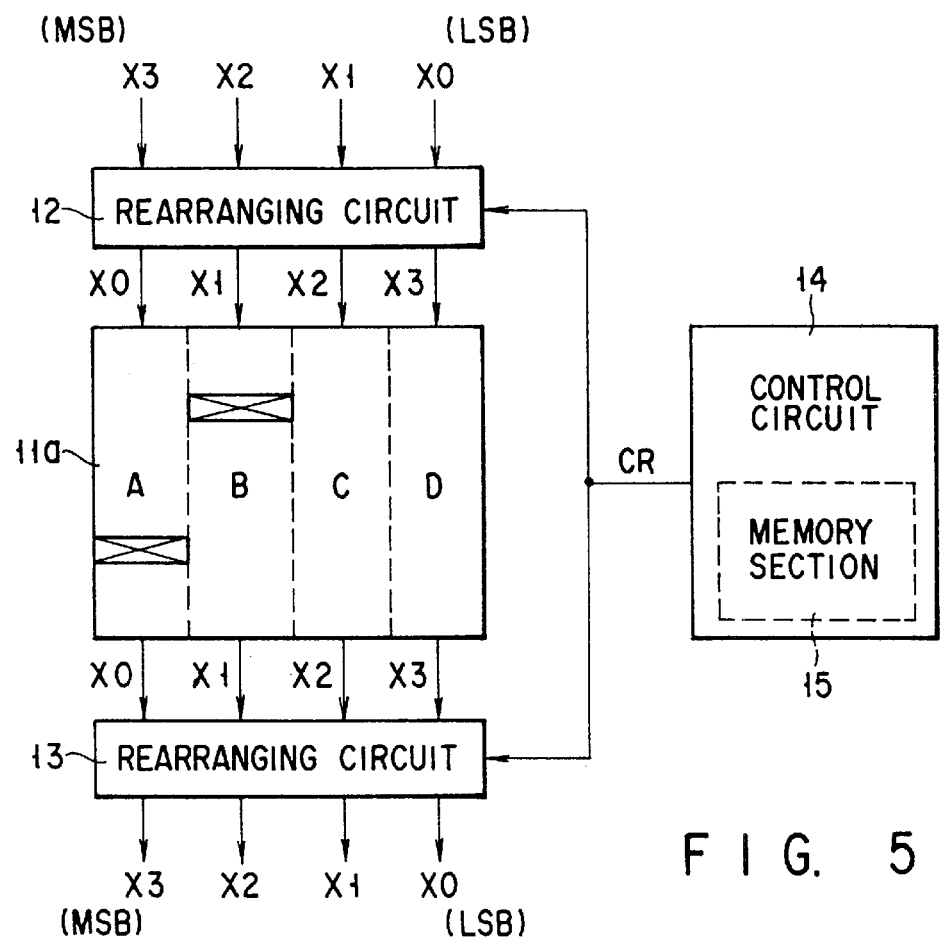
FIG. 5 is a block diagram showing the read-write device and the memory device related to the first embodiment of the present invention.

FIG. 5 shows the case where defects exist in more than one regions among four regions of RAM 11a.

In this case, the information regarding defects of memory cells is stored in the memory section 15 of the control circuit 14. When there are defects in more than one region among four regions of RAM 11a, the rearranging circuit 12 is controlled, as shown in Table 3, by the control signal CR (error pattern E3 to E0), and the rearranging circuit 13 is controlled, as shown in Table 4, by the control signal CR (error pattern E3 to E0).

TABLE 3

| Error Pattern E3,E2,E1,E0 | Input Output | Error Pattern E3,E2,E1,E0 | Input Output | Error Pattern E3,E2,E1,E0 | Input Output | Error Pattern E3,E2,E1,E0 | Input Output |
|---|---|---|---|---|---|---|---|
| 0000 | X3X2X1X0<br>X3X2X1X0 | 0100 | X3X2X1X0<br>X3X0X1X2 | 1000 | X3X2X1X0<br>X0X2X1X3 | 1100 | X3X2X1X0<br>X0X1X2X3 |
| 0001 | X3X2X1X0<br>X3X2X1X0 | 0101 | X3X2X1X0<br>X3X1X2X0 | 1001 | X3X2X1X0<br>X1X2X3X0 | 1101 | X3X2X1X0<br>X1X2X3X0 |
| 0010 | X3X2X1X0<br>X3X2X1X0 | 0110 | X3X2X1X0<br>X3X0X1X2 | 1010 | X3X2X1X0<br>X0X2X1X3 | 1110 | X3X2X1X0<br>X0X2X1X3 |
| 0011 | X3X2X1X0<br>X3X2X1X0 | 0111 | X3X2X1X0<br>X3X2X1X0 | 1011 | X3X2X1X0<br>X3X2X1X0 | 1111 | X3X2X1X0<br>X3X2X1X0 |

TABLE 4

| Error Pattern E3,E2,E1,E0 | Input Output | Error Pattern E3,E2,E1,E0 | Input Output | Error Pattern E3,E2,E1,E0 | Input Output | Error Pattern E3,E2,E1,E0 | Input Output |
|---|---|---|---|---|---|---|---|
| 0000 | X3X2X1X0<br>X3X2X1X0 | 0100 | X3X0X1X2<br>X3X2X1X0 | 1000 | X0X2X1X3<br>X3X2X1X0 | 1100 | X0X1X2X3<br>X3X2X1X0 |
| 0001 | X3X2X1X0<br>X3X2X1X0 | 0101 | X3X1X2X0<br>X3X2X1X0 | 1001 | X1X2X3X0<br>X3X2X1X0 | 1101 | X1X2X3X0<br>X3X2X1X0 |
| 0010 | X3X2X1X0<br>X3X2X1X0 | 0110 | X3X0X1X2<br>X3X2X1X0 | 1010 | X0X2X1X3<br>X3X2X1X0 | 1110 | X0X2X1X3<br>X3X2X1X0 |
| 0011 | X3X2X1X0<br>X3X2X1X0 | 0111 | X3X2X1X0<br>X3X2X1X0 | 1011 | X2X3X1X0<br>X3X2X1X0 | 1111 | X3X2X1X0<br>X3X2X1X0 |

In the case that a memory cell has defects in, for example, region A and region B of RAM 11a, respectively, the control circuit 14 gives 1, 1, 0, 0 to respective selectors S3 to S0 of the rearranging circuit 12 as the control signal CR. As a result, selector S3 selects bit X0, selector 32 selects bit X1, selector S1 selects bit X2, and selector S0 selects bit X3.

Therefore, the four bits of image data or music data are rearranged from X3 (MSB), X2, X1, X3 (LSB) to X0 (LSB), X1, X2, X3 (MSB). Namely, bit X0 is written in the memory cell of region A and bit X1 is written in the memory cell of region B.

Furthermore, in the case that a memory cell has defects in region A and region B of RAM 11a, respectively, the control circuit 14 gives 1, 1, 0, 0 to respective selectors S3' to S0' of the rearranging circuit 13 as the control signal CR. As a result, selector S3' selects bit X3, selector S2 selects bit X2, selector S1 selects bit X1, and selector S0 selects bit X0.

Therefore, the four bits of image data or music data are rearranged from X0 (LSB), X1, X2, X3 (MSB) to X3 (MSB), X2, X1, X0 (LSB).

Figure 6:
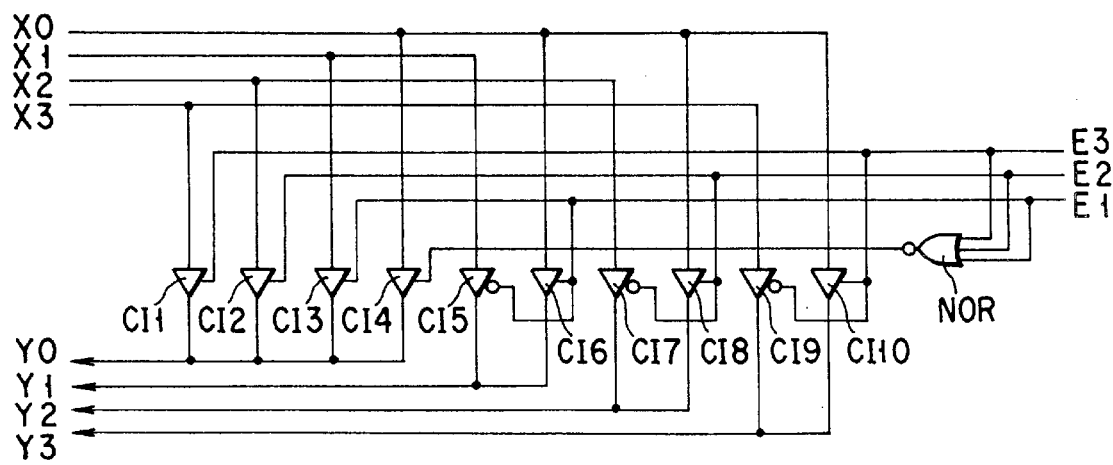
FIG. 6 is a view showing the structure of a selector of FIGS. 3 and 4.

FIG. 6 shows one example of the circuit structure of selectors S3 to S0 of FIG. 3.

This circuit structure of selectors is used in the case where there is a defect only in one region among four regions A to D of RAM 11a.

In FIG. 6, CI1 to CI10 represent clock inverters, NOR represents a NOR gate, and E3 to E1 represent error patterns. (In this case, E0 is not shown because E0 is corresponding to a position of the LSB in the data.)

In the first embodiment, when there exists a memory cell having a defect in any one region, the LSB is always stored in that region. Namely, when a memory cell having a defect is selected in region A, the LSB is always stored in the memory cell of region A, and even if a normal memory cell is selected in region A, the LSB is always stored in the memory cell of region A.

Accordingly, in the second embodiment, there is provided a memory circuit which can determine whether the bit data is rearranged for every address or not.

Figure 7:
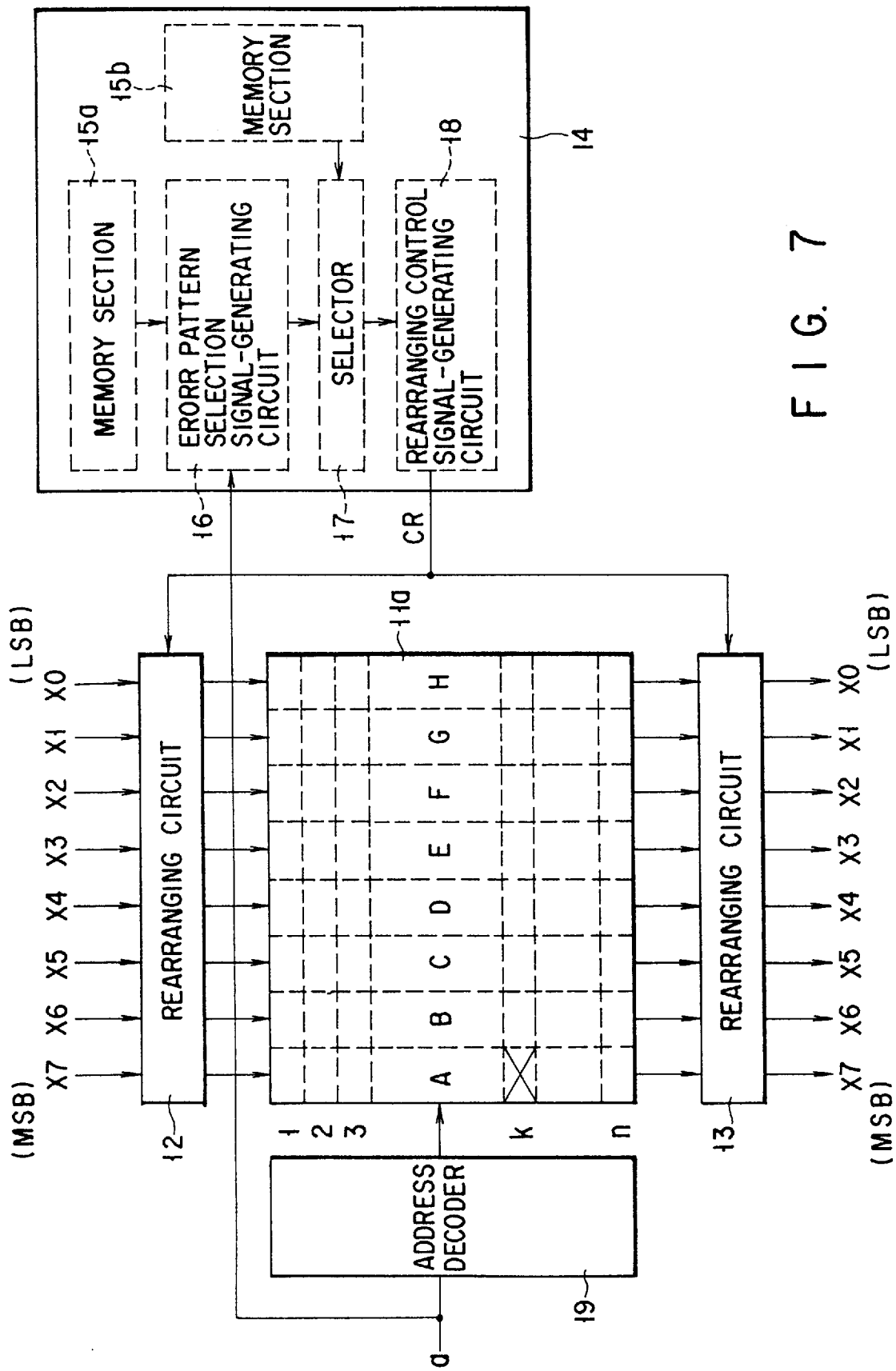
FIG. 7 is a block diagram showing the read-write device and the memory device related to a second embodiment of the present invention.

FIG. 7 shows a memory device relating to the second embodiment of the present invention.

This memory device relates to a semiconductor memory (RAM). In addition, for example, with respect to digital audio signals, the music data is typically represented by 16 bits, but in the following description, an 8 bits case will be described for the ease of description.

First, the structure of this semiconductor memory will be explained.

RAM 11a has a plurality of memory cells formed in rows and columns. RAM 11a is divided into eight regions in the direction of, for example, rows, to constitute regions A to H. The rearranging circuit 12 rearranges respective bits representing image data, music data and the like having different significances to store them in RAM 11a. The rearranging circuit 13 rearranges respective bits representing image data, music data and the like read out from RAM 11a and outputs them.

The control circuit 14 includes memory sections (for example, ROM) 15a and 15b. The memory section 15a stores the error address which selects the row where a defective memory cell exists. The memory section 15b stores the region (error pattern) where defective memory cells exist among the eight regions A to H, in one row selected by the error address.

The control circuit 14 includes an error pattern selection signal-generating circuit 16, a selector 17 and a rearranging control signal-generating circuit 18.

The error pattern selection signal-generating circuit 16 receives an address signal "a" and the output signal (error address) of the memory section 15a, and outputs the error pattern selection signal when address "a" agrees with the error address.

The selector 17 selects the output signal (error pattern) of the memory section 15b based on the type of the error pattern selection signal and outputs it. The rearranging control signal-generating circuit 18 provides a three-bit rearrangement control signal CR to the rearrangement control circuits 12 and 13, based on the error pattern output from the selector 17.

The address decoder receives address "a", and selects one row among n rows (n represents an integer) of RAM 11a.

Figure 8:
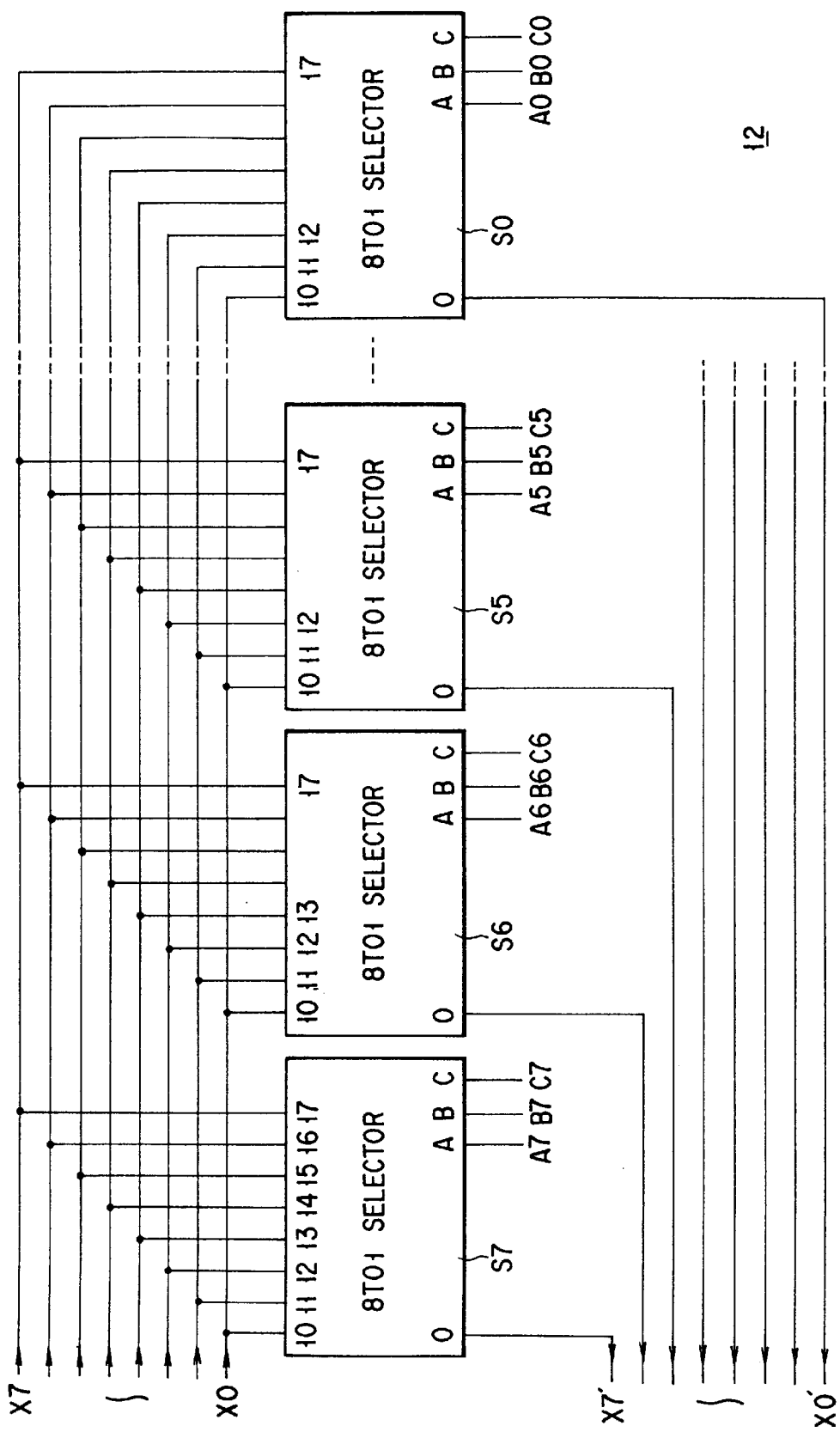
FIG. 8 is a view showing the structure of the rearranging circuit of FIG. 7.

FIG. 8 shows one example of the rearranging circuit 12 of FIG. 7.

The rearranging circuit 12 is composed of eight selectors S7 to S0. To respective selectors S7 to S0 of the rearranging circuit 12 are input the rearrangement control signal CR (Am, Bm, Cm (m is from 0 to 7) and eight-bit data X7–X0 representing image data, music data and the like. Respective selectors S7 to S0 select a predetermined one-bit data, as shown in Table 5, based on the rearrangement control signal (Am, Bm, Cm) CR, and outputs this selected one-bit data. The reference numerals e7–e0 is an error pattern, as described more fully below.

First, at the time of production or at the time of initiation of the system, the write test and the read test of the data in the semiconductor memory are conducted, to examine whether a memory cell having defects such that image data or music data cannot be recorded or is recorded wrong exist in RAM 11a or not. When a memory cell having a defect exists in RAM 11a, the address of the memory cell having the defect and the region in which the memory cell exists are confirmed. The information relating to the address of the memory cell having the defect is stored in the memory section 15a of the control circuit 14, and the information relating to the region where the memory cell having the defect exists is stored in the memory section 15b of the control circuit 14.

At the time of storage of image data or music data, when address "a" and data X7–X0 are given, address "a" is input to the address decoder 19 and the error pattern selection signal-generating circuit 16. The address decoder 19 decodes address "a", and selects one row of RAM 11a. The error pattern selection signal-generating circuit 16 compares address "a" with the error address of the memory section 15a, and when both of them agree with each other, it outputs the error pattern selection signal.

TABLE 5

| | | | | | | | | Select Signal | | | | | | | | | | | | | | | |
|---|---|---|---|---|---|---|---|---|---|---|---|---|---|---|---|---|---|---|---|---|---|---|---|
| e7 | e6 | e5 | e4 | e3 | e2 | e1 | e0 | C7 | B7 | A7 | C6 | B6 | A6 | C5 | B5 | A5 | C4 | B4 | A4 | C3 | B3 | A3 | C2 | B2 | A2 |
| 0 | 0 | 0 | 0 | 0 | 0 | 0 | 0 | 1 | 1 | 1 | 1 | 1 | 0 | 1 | 0 | 1 | 1 | 0 | 0 | 0 | 1 | 1 | 0 | 1 | 0 |
| 0 | 0 | 0 | 0 | 0 | 0 | 0 | 1 | 1 | 1 | 1 | 1 | 1 | 0 | 1 | 0 | 1 | 1 | 0 | 0 | 0 | 1 | 1 | 0 | 1 | 0 |
| 0 | 0 | 0 | 0 | 0 | 0 | 1 | 0 | 1 | 1 | 1 | 1 | 1 | 0 | 1 | 0 | 1 | 1 | 0 | 0 | 0 | 1 | 1 | 0 | 1 | 0 |
| 0 | 0 | 0 | 0 | 0 | 1 | 0 | 0 | 1 | 1 | 1 | 1 | 1 | 0 | 1 | 0 | 1 | 1 | 0 | 0 | 0 | 1 | 1 | 0 | 0 | 0 |
| 0 | 0 | 0 | 0 | 1 | 0 | 0 | 0 | 1 | 1 | 1 | 1 | 1 | 0 | 1 | 0 | 1 | 1 | 0 | 0 | 0 | 0 | 0 | 0 | 1 | 0 |
| 0 | 0 | 0 | 1 | 0 | 0 | 0 | 0 | 1 | 1 | 1 | 1 | 1 | 0 | 1 | 0 | 1 | 0 | 0 | 0 | 0 | 1 | 1 | 0 | 1 | 0 |
| 0 | 0 | 1 | 0 | 0 | 0 | 0 | 0 | 1 | 1 | 1 | 1 | 1 | 0 | 0 | 0 | 0 | 1 | 0 | 0 | 0 | 1 | 1 | 0 | 1 | 0 |
| 0 | 1 | 0 | 0 | 0 | 0 | 0 | 0 | 1 | 1 | 1 | 0 | 0 | 0 | 1 | 0 | 1 | 1 | 0 | 0 | 0 | 1 | 1 | 0 | 1 | 0 |
| 1 | 0 | 0 | 0 | 0 | 0 | 0 | 0 | 0 | 0 | 0 | 1 | 1 | 0 | 1 | 0 | 1 | 1 | 0 | 0 | 0 | 1 | 1 | 0 | 1 | 0 |

| | | | | | | | | Select Signal | | | | | | Output | | | | | | | |
|---|---|---|---|---|---|---|---|---|---|---|---|---|---|---|---|---|---|---|---|---|---|
| e7 | e6 | e5 | e4 | e3 | e2 | e1 | e0 | C1 | B1 | A1 | C0 | B0 | A0 | X'7 | X'6 | X'5 | X'4 | X'3 | X'2 | X'1 | X'0 |
| 0 | 0 | 0 | 0 | 0 | 0 | 0 | 0 | 0 | 0 | 1 | 0 | 0 | 0 | X7 | X6 | X5 | X4 | X3 | X2 | X1 | X0 |
| 0 | 0 | 0 | 0 | 0 | 0 | 0 | 1 | 0 | 0 | 1 | 0 | 0 | 0 | X7 | X6 | X5 | X4 | X3 | X2 | X1 | X0 |
| 0 | 0 | 0 | 0 | 0 | 0 | 1 | 0 | 0 | 0 | 0 | 0 | 0 | 1 | X7 | X6 | X5 | X4 | X3 | X2 | X0 | X1 |
| 0 | 0 | 0 | 0 | 0 | 1 | 0 | 0 | 0 | 0 | 1 | 0 | 1 | 0 | X7 | X6 | X5 | X4 | X3 | X0 | X1 | X2 |
| 0 | 0 | 0 | 0 | 1 | 0 | 0 | 0 | 0 | 0 | 1 | 0 | 1 | 1 | X7 | X6 | X5 | X4 | X0 | X2 | X1 | X3 |
| 0 | 0 | 0 | 1 | 0 | 0 | 0 | 0 | 0 | 0 | 1 | 1 | 0 | 0 | X7 | X6 | X5 | X0 | X3 | X2 | X1 | X4 |
| 0 | 0 | 1 | 0 | 0 | 0 | 0 | 0 | 0 | 0 | 1 | 1 | 0 | 1 | X7 | X6 | X0 | X4 | X3 | X2 | X1 | X5 |
| 0 | 1 | 0 | 0 | 0 | 0 | 0 | 0 | 0 | 0 | 1 | 1 | 1 | 0 | X7 | X0 | X5 | X4 | X3 | X2 | X1 | X6 |
| 1 | 0 | 0 | 0 | 0 | 0 | 0 | 0 | 0 | 0 | 1 | 1 | 1 | 1 | X0 | X6 | X5 | X4 | X3 | X2 | X1 | X7 |

Figure 9:
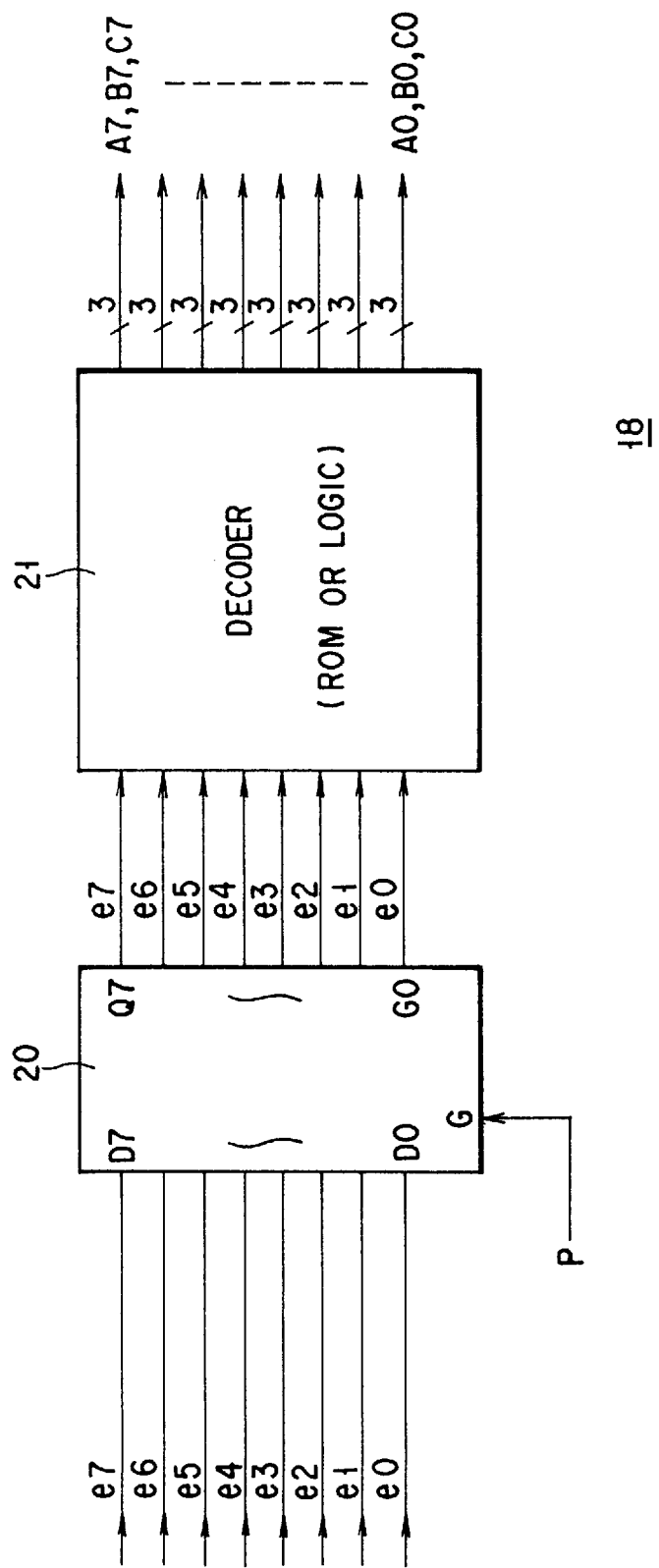
FIG. 9 is a view showing the structure of the rearrangement control signal-generating circuit of FIG. 7.
Figure 10:
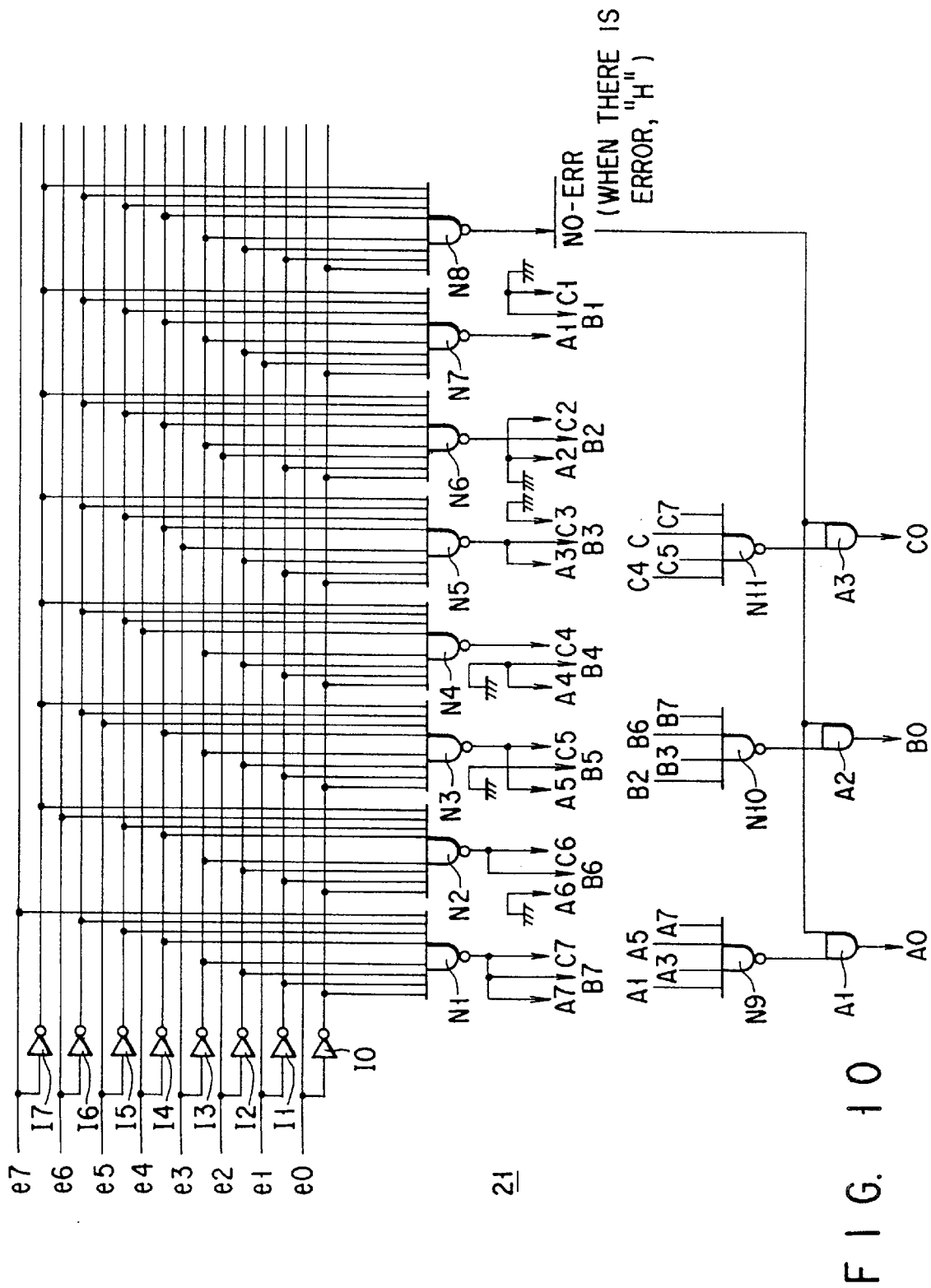
FIG. 10 is a circuit diagram showing the decoder of FIG. 9.

FIG. 9 shows one example of the circuit structure of the rearrangement control signal-generating circuit 18 of FIG. 7, and FIG. 10 shows one example of decoder 21 of FIG. 9.

The structure of this rearrangement control signal-generating circuit is used when there is a defect in only one region among the eight regions A to H of RAM 11a.

Reference numerals e7 to e0 represent the error pattern output from the memory section 15b. The error pattern e7–e0 passes through a latch circuit 20, and is decoded by a decoder 21. The latch circuit 20 is controlled by the latch pulse P, and the decoder 21 outputs the rearrangement control signal (Am, Bm, Cm) CR.

Reference numerals I0–I7 represent inverters, N1–N11 represent NAND gates, and A1–A3 represent AND gates. The signal/NO-ERR becomes "1" when a defective memory cell is connected to the line selected by a predetermined address, i.e., when at least one of e7 to e0 becomes "1".

Next, the operation of this semiconductor memory will be described.

First, the case where address "a" does not agree with the error address will be described. In this case, since the error pattern selection signal is not output, the selector 17 selects the error pattern (e7–e0 are all "0") corresponding to there being no defective memory cell, and this error pattern is given to the rearrangement control signal-generating circuit 18. The rearrangement control signal-generating circuit 18 decodes this error pattern, and as shown in Table 5, gives a predetermined rearrangement control signal (Am, Bm, Cm) CR to the rearranging circuits 12 and 13.

The rearranging circuit 12 transfers the 8-bit data X7–X0 directly to RAM 11a without rearranging the 8-bit data X7–X0. Data X7–X0 are stored in respective memory cells of the one row selected by address "a".

Next, the case where address "a" agrees with the error address will be described. In this case, since the error pattern selection signal is output, the selector 17 selects the error pattern (one of e7–e0 is "0") which means there exists a defective memory cell, and this error pattern is given to the rearrangement control signal-generating circuit 18. The rearrangement control signal-generating circuit 18 decodes this error pattern, and as shown in Table 5, gives a predetermined rearrangement control signal (Am, Bm, Cm) CR to the rearranging circuits 12 and 13. The rearranging circuit 12 rearranges data X7–X0 so that when a memory cell having a defect exists in a region to store a bit having large significance, such as the MSB, the LSB is stored in that region.

When a memory cell having a defect exists in, for example, region A of RAM 11a, the error pattern is such that only e7 becomes "1". Therefore the rearranging circuit 12 rearranges eight bits representing image data or music data from X7 (MSB), X6, –X1, X0 (LSB) to X0 (LSB), X6, –X1, X7 (MSB), so that the LSB is stored in region A and the MSB is stored in region H. Namely, bit X0 is written in the defective memory cell of region A.

Furthermore, the rearranging circuit 13 rearranges the 8-bit data X0 (LSB), X6, –X1, X7 (MSB) output from RAM 11a to X7 (MSB), X6, –X1, X0 (LSB). Namely, the rearranging circuit 13 rearranges the order of image data or music data to the original state and outputs it.

In the second embodiment, the description has been provided for the case in which a defective memory cell exists in only one region among eight regions of RAM 11a, but it can apply to the case in which defective memory cells exist in more than one region among the eight regions of RAM 11a.

In the above-mentioned first and second embodiments, the rearrangement of data is carried out in units of one bit. However, since the actual music data and image data are typically 16 bits or more, if the rearrangement of data is carried out in units of one bit, the structures of rearranging circuits 12 and 13, and the control circuit 14 become complicated, and the circuit size becomes large.

Therefore, in third and fourth embodiments described below, there is provided a memory device in which RAM 11a is divided into plural blocks, and, for example, 16 bits data is rearranged in units of plural bits.

Figure 11:
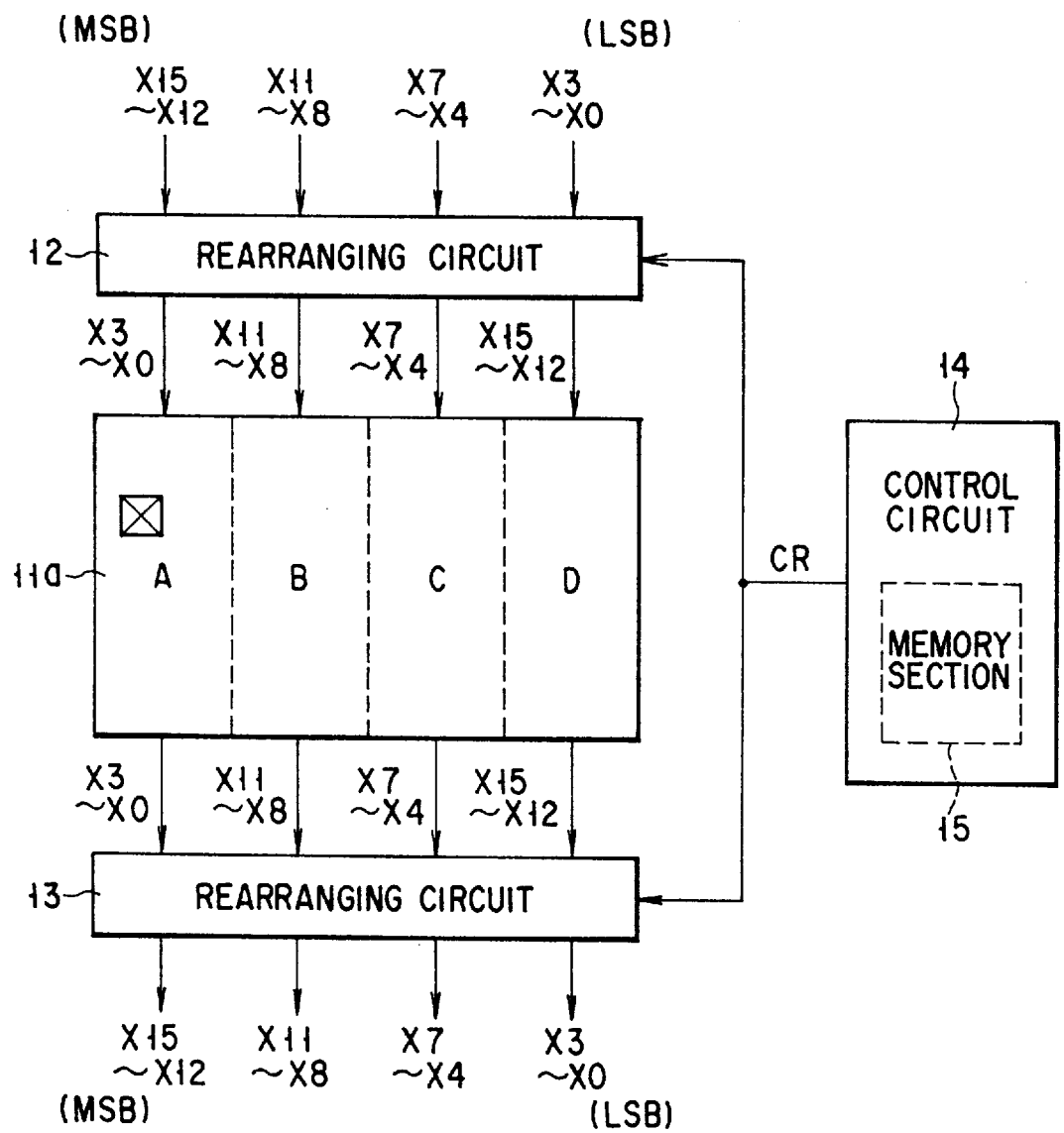
FIG. 11 is a block diagram showing the read-write device and the memory device related to a third embodiment of the present invention.

FIG. 11 shows a memory device relating to the third embodiment of the present invention.

This memory device relates to a semiconductor memory (RAM). In the present embodiment, a description will be provided regarding the case in which 16 bits music data in digital audio is stored in the RAM 11a.

First, the structure of this semiconductor memory will be described.

RAM 11a has a plurality of memory cells formed in rows and columns. RAM 11a is divided into four regions in the direction of, for example, rows, to constitute regions A to D. The rearranging circuit 12 rearranges respective bits representing image data, music data and the like having different significances to store the bits in RAM 11a. The rearranging circuit 13 rearranges respective bits representing image data, music data and the like read out from RAM 11a and outputs the bits.

The control circuit 14 includes a memory section 15 (for example, ROM). The control circuit 14 gives a rearrangement control signal CR to the rearranging circuits 12 and 13 based on the data stored in the memory section 15, to control the rearrangement of respective bits in the rearranging circuits 12 and 13.

Next, the operation of this semiconductor memory will be described.

First, at the time of production or at the time of initiation of the system, a write test and a read test of the data in the semiconductor memory are conducted, to examine whether a memory cell having such defects that image data or music data cannot be recorded or is recorded wrong exists in RAM 11a or not. When a memory cell having a defect exists in RAM 11a, it is confirmed in which region of RAM 11a the memory cell having the defect exists. The information regarding the defect of memory cells is stored in the memory section 15 of the control circuit 14.

The control circuit 14 gives the rearrangement control signal CR to the rearranging circuit 12 based on the information of the memory section 15, when the image data or the music data is stored. This rearrangement control signal CR determines the arrangement of respective bits of the image data or the music data. Namely, when the memory cell having a defect exists in a region where bits having large significance on the MSB side of the 16 bits data are stored, the control circuit 14 gives to the rearranging circuit 12 such a control signal CR that bits on the LSB side of the 16 bits data are stored in the region.

For example, when there exists a memory cell having a defect in region A of RAM 11a, the control circuit 14 controls the rearranging circuit 12 so that bits X3 to X0 are stored in region A, bits X1 to X8 are stored in region B, bits X7 to X4 are stored in region C, and bits X15 to X12 are stored in region D.

Therefore, 16 bits of image data or music data are rearranged from X15 (MSE) to X0 (LSB) to X3–X0, X11–X8, X7–X4, and X15–X12. Namely, bits X3–X0 on LSB side are written in the memory cell of region A.

Furthermore, when there exists a memory cell having a defect in region A of RAM 11a, the rearranging circuit 13 rearranges bits X3–X0, X11–X8, X7–X4 and X15–X12 read out from RAM 11a to X15 (MSB) –X0 (LSB).

In addition, the present embodiment can apply to the case where defects exist in more than one region among four regions of RAM 11a.

Figure 12:
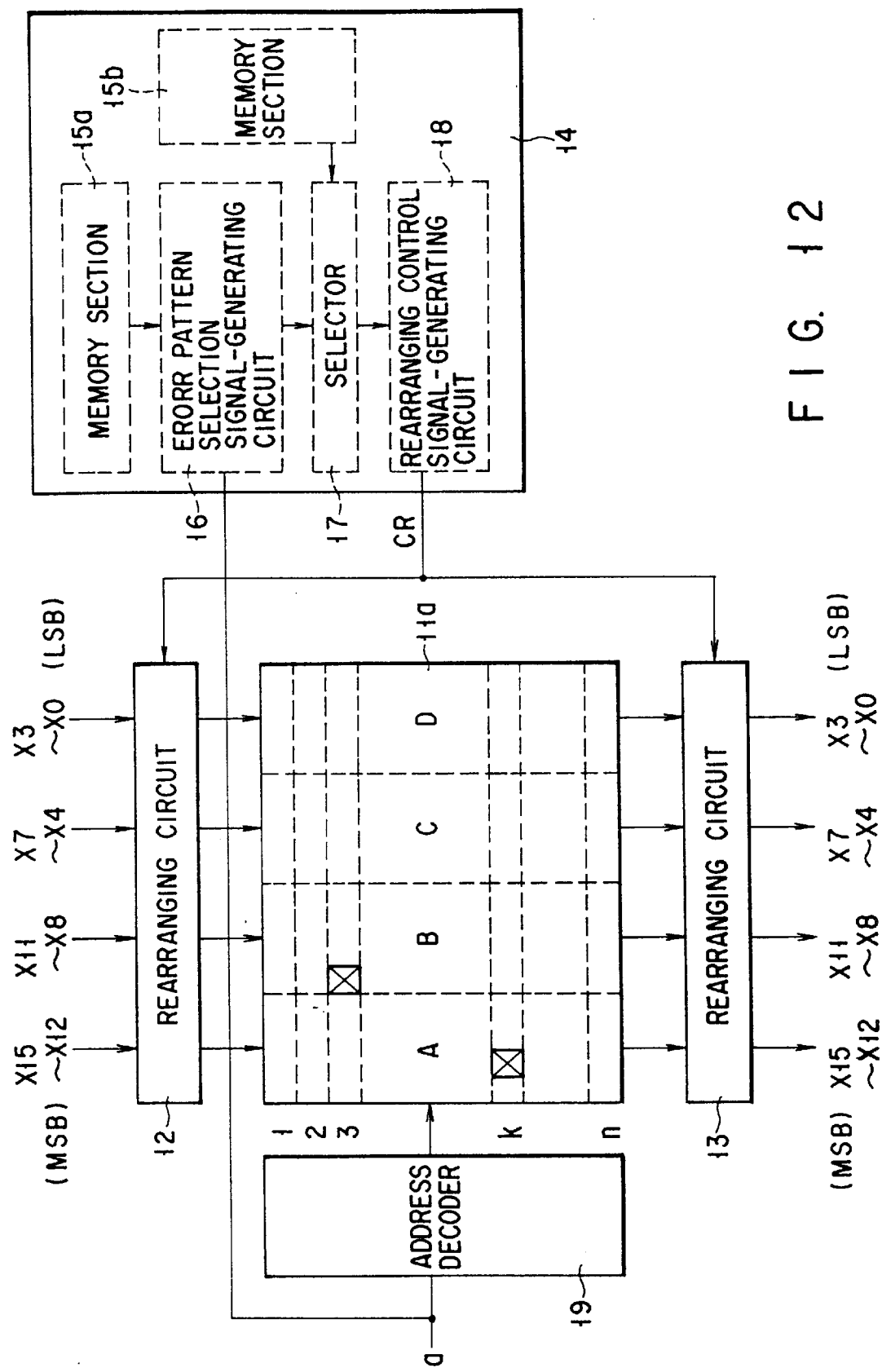
FIG. 12 is a block diagram showing the read-write device and the memory device related to a fourth embodiment of the present invention.

FIG. 12 shows a memory device relating to the fourth embodiment of the present invention.

This memory device relates to a semiconductor memory (RAM). In the present embodiment, the description will be made regarding the case where 16 bits music data in digital audio is stored in RAM.

First, the structure of this semiconductor memory will be described.

RAM 11a has a plurality of memory cells formed in rows and columns. RAM 11a is divided into four regions in the direction of, for example, rows, to constitute regions A to D. The rearranging circuit 12 rearranges respective bits representing image data, music data and the like having different significances to store the bits in RAM 11a. The rearranging circuit 13 rearranges respective bits representing image data, music data and the like read out from RAM 11a and outputs the bits.

The control circuit 14 includes memory sections (for example, ROM) 15a and 15b. The memory section 15a stores the error address which selects the row where a defective memory cell exists. The memory section 15b stores the region (error pattern) where a defective memory cell exists among the eight regions A to H, in one row selected by the error address.

The control circuit 14 includes an error pattern selection signal-generating circuit 16, a selector 17 and a control signal-generating circuit 18. The error pattern selection signal-generating circuit 16 receives address "a" and the output signal (error address) of the memory section 15a, outputs the error pattern selection signal when address "a" agrees with the error address.

The selector 17 selects the output signal (error pattern) of the memory section 15b based on the type of the error pattern selection signal and outputs it. The rearrangement control signal-generating circuit 18 gives the rearrangement control signal CR to the rearrangement control circuits 12 and 13, based on the error pattern output from the selector 17.

The address decoder 19 receives address "a", and selects one line among n lines (n represents natural numbers) of RAM 11a.

Next, the operation of this semiconductor memory will be described.

First, at the time of production or at the time of initiation of the system, a write test and a read test of the data in the memory circuit are conducted, to examine whether a memory cell having such defects that image data or music data cannot be recorded or is recorded wrong exist in RAM 11a or not. When a memory cell having a defect exists in RAM 11a, the address of the memory cell having the defect and the region where the memory cell exists are confirmed. The information relating to the address of the memory cell having the defect is stored in the memory section 15a of the control circuit 14, and the information relating to the region where the memory cell having a defect exists is stored in the memory section 15b of the control circuit 14.

At the time of storage of image data or music data, when address "a" and data X15–X0 are given, address "a" is input to the address decoder 19 and the error pattern selection signal-generating circuit 16.

The address decoder 19 decodes address "a", and selects one row of RAM 11a. The error pattern selection signal-generating circuit 16 compares address "a" with the error address of the memory section 15a, and when both of them agree with each other, it outputs the error pattern selection signal.

First, the case where address "a" does not agree with the error address will be described. In this case, since the error pattern selection signal is not output, the selector 17 selects the error pattern which means that there is no defective memory cell, and this error pattern is given to the rearrangement control signal-generating circuit 18. The rearrangement control signal-generating circuit 18 decodes this error pattern, and gives a predetermined rearrangement control signal CR to the rearranging circuits 12 and 13.

The rearranging circuit 12 transfers the 16 bits data X15–X0 directly to RAM 11a without rearranging the 16 bits data X15–X0. Data X15–X0 are stored in respective memory cells of the one row selected by address "a".

Next, the case where address "a" agrees with the error address will be described. In this case, since the error pattern selection signal is output, the selector 17 selects the error pattern which means there exists a defective memory cell, and this error pattern is given to the rearrangement control signal-generating circuit 18.

The rearrangement control signal-generating circuit 18 decodes this error pattern, and gives a predetermined rearrangement control signal CR to the rearranging circuits 12 and 13. The rearranging circuit 12 rearranges data X15–X0 so that when a memory cell having a defect exists in a region to store a bit having greater significance on the MSB side of the 16 bits data, bits on the LSB side are stored in said region.

In the present embodiment, the description has been made for the case where a memory contains a defect in only one region among the four regions of RAM 11a, but it can apply to the case where inferior memory cells exist in more than one regions among the four regions of RAM 11a.

In the first to the fourth embodiments described above, the rearranging circuits 12 and 13 can be composed of selectors, shift registers or the like.

FIG. 13 shows an example in which shift registers are used for the rearranging circuits. FIG. 14 shows the action of shift registers 22 and 23 of FIG. 13.

In this case, the control circuit 14 gives a clock signal CK1 to the shift register 22 and a clock signal CK2 to the shift register 23. The shift registers 22 and 23 rearrange the input data (for example, 8-bit X7–X0) according to the number of clock signals. More particularly, in the case where a defective memory cell exists in RAM 11a, the shift register 22 rearranges the input data so that LSBX0 is always stored in the defective memory cell. Furthermore, the shift register 23 rearranges the data output from RAM 11a in the correct order and outputs it as the output data.

For example, as shown in FIG. 14, the shift register 22 receives the eight bit input data X7–X0 and the clock signal CK1. As a result, the data is shifted to effect a rearrangement in which LSBX0 is aligned for storage in the defective memory cell. Further, the shift register 23 receives the data written in RAM and the clock signal CK2. As a result, the data is shifted to effect a rearrangement in which the correct order of the bits is achieved.

Also, in the first to the fourth embodiments described above, information relating to regions where the error address and defective memory cells exist are stored in the memory section of the control circuit, however, alternatively, they may be-supplied from outside, i.e., outside of the IC on which the memory circuit of the present invention is formed.

Further, the present invention can apply to recording media having a structure in which significances is given differently for every bit and a portion to store data is specified by an address, for example, media such as a hard disk, floppy disk, CD-RAM, SD-RAM, MO, PD, MT and the like, other than a semiconductor memory.

FIG. 15 shows a memory device according to the fifth embodiment of the present invention.

This memory device relates to a drive device such as a HD (hard disk), FD (floppy disk), CD-RAM, SD-RAM, MO (magneto-optical disk), PD (phase change rewrite-type disk) and MT (magnetic tape).

In the present embodiment, the description will be made for a case in which music data of 16 bits in the digital audio is written in a memory section 11 (HD, FD, CD-RAM, SD-RAM, MO, PD, MT and the like).

First, the structure of this memory device will be described.

The rearranging circuit 12 rearranges the write data X15–X0 when a defective portion exists in a predetermined memory region of the memory section 11. The write data X15–X0 have different significances, and the X15 having the greatest significance as the MSB and X0 having the least significance as the LSB. Thus, data X15–X0 is composed of a continuous sequence of 16 bits.

The write data output from the rearranging circuit 12 is input to a modulation section 25 through a parity addition section 24.

In the modulation section 25, for example, write data is EFM-modulated. The EFM-modulated write data is written in a predetermined memory region of the memory section 11.

Here, in the case where writing of a predetermined bit into a predetermined memory region of the memory section 11 is scheduled, when the defective portion exists in the predetermined memory region, a bit having lower significance (optimally, LSB) than that of the predetermined bit is written to the predetermined memory region. The read data read out from the memory section 11 is input to a demodulation section 26. In the demodulation section 26, for example, read data is EFM-demodulated. The EFM-demodulated read data is subjected to error correction processing in an error correction section 27.

The output data of the error correction section 27 is input to the rearranging circuit 13. The rearranging circuit 13 rearranges the 16 bits X15–X0, so that the read data read out from the memory section 11 is arranged in the correct position.

The action of the rearranging circuits 12 and 13 are controlled by the control circuit 14.

The control circuit 14 receives address "a", and rearranges the write data or the read data when this address designates the defective portion in the memory section 11.

The defective portion of the memory section 11 can be identified in advance by an inspection, and the information relating to this defective portion can be stored in the memory section within the control circuit 14.

Additionally or alternatively, a detection circuit for detecting a defective portion of the memory section 11 may be arranged in the memory device of the present embodiment, so that the write data or the read data is rearranged based on the information relating to the defective portion of the memory section 11 which this detection circuit has.

As described above, according to the semiconductor memory of the present invention, effects as described below can be exhibited.

In a memory circuit for storing image data, music data and the like related to the human sense of sight or hearing, the rearranging circuit of the present invention can reduce an effect due to defects of a memory cell or a sector to a minimum, not by blocking a memory cell having a defect or avoiding a sector having a defect, but by rearranging the data.

Namely, when there is a defect in a part of the memory section such as RAM, ROM, FD and HD, respective bits representing image data, music data or the like are rearranged by the rearranging circuits so that the LSB (least significant bit) is stored in the defect region.

Accordingly, as shown in FIG. 16 in which the magnitude of data is plotted, the data stored in the defect portion differs from the original data, but the difference between the data stored in the defect portion and the original data is suppressed to a minimum. Furthermore, such degree of difference cannot be recognized by the human sense of sight or hearing, therefore there is no inconvenience in the reproduction of image data and music data.

Furthermore, since a circuit for blocking a memory cell having a defect portion or avoiding a sector having a defect is not required, the circuit size can be reduced.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A memory device for storing data composed of plural bits having different significances, comprising:

memory means having a plurality of regions;

rearranging means for rearranging said plural bits when a first one of said regions includes a defective portion and a first of said plural bits is to be written into said first region; and control means for controlling said rearranging means so that a second of said plural bits having a lower significance than that of said first bit is written into said first region and the first bit is written into another one of said plurality of regions.

2. A memory device according to claim 1, wherein said rearranging means is a first rearranging means; said memory device further comprising:

second rearranging means for rearranging said plural bits read out from said memory means;

wherein said control means includes means for controlling said second rearranging means so that the first and second bits read out from said memory means are returned to correct positions.

3. A memory device according to claim 1, wherein a second one of said plurality of regions includes a defective portion and a third of said plural bits is to be written into said second region, said control means includes means for controlling said rearranging means so that a fourth of said plural bits with a lower significance than that of said third bit is written into said second region and said third bit is written into another one of said plurality of regions.

4. A memory device according to claims 1, 2 or 3, wherein said second bit is a LSB (least significant bit).

5. A memory device according to claim 2, wherein said first and second rearranging means are composed of a plurality of selectors.

6. A memory device according to claim 1, wherein said rearranging means includes a shift register for receiving said plural bits, and said control means for controlling said shift register to shift said second bit for writing into said first region.

7. A memory device according to claims 1 or 2, wherein said control means has a memory section for storing information relating to said first region.

8. A memory device according to claim 3, wherein said control means has a memory section for storing information relating to said first and second regions.

9. A memory device according to claims 1, 2 or 3 wherein said plurality of regions are memory regions of one of a semiconductor memory, a hard disk, a floppy disk, a CD-RAM, a SD-RAM, a magneto-optical disk, a phase change rewrite-type disk or a magnetic tape.

10. A memory device for storing data composed of plural bits having different significances, comprising:

memory means having a plurality of portions divided into regions;

address means for providing an address designating the portion of said memory means where said plural bits are to be stored;

rearranging means for rearranging said plural bits when a first one of said regions includes a defective portion and said address designates the defective portion for writing a first of said plural bits; and control means for controlling said rearranging means so that a second of said plural bits having a lower significance than that of said first bit is written into said first region and said first bit is written into another one of said regions.

11. A memory device according to claim 10, wherein said rearranging means is a first rearranging means;
said memory device further comprising:
second rearranging means for rearranging said plural bits read out from said memory means;
wherein said control means includes means for controlling said second rearranging means so that the first and second bits read out from said memory means are returned to correct positions.

12. A memory device according to claim 10, wherein a second one of said regions includes a defective portion and said address designates said defective portion for writing a third of said plural bits;
said control means includes means for controlling said rearranging means so that a fourth of said plural bits having a lower significance than that of said third bit is written into said second region and said third bit is written into another one of said plurality of regions.

13. A memory device according to claims 10, 11 or 12, wherein said second bit is a LSB (least significant bit).

14. A memory device according to claim 11, wherein said first and second rearranging means are composed of a plurality of selectors.

15. A memory device according to claim 10, wherein said rearranging means includes a shift register for receiving said plural bits, and said control means for controlling said shift register to shift said second bit for writing into said first region.

16. A memory device according to claims 10 or 11, wherein said control means includes a memory section for storing information regarding an error address designating said defective portion, and for storing information of said first region, and
said control means includes means for controlling said rearranging means so that said second bit is written in said first region, when the address designated by said address means agrees with the error address.

17. A memory device according to claims 10, 11 or 12, wherein said regions are memory regions of one of a semiconductor memory, a hard disk, a floppy disk, a CD-RAM, a SD-RAM, a magneto-optical disk, a phase change rewrite-type disk or a magnetic tape.

18. A memory device for storing data composed of plural bits having different significances, comprising:
memory means having a plurality of regions;
rearranging means for rearranging said plural bits when a first one of said regions includes a defective portion and a first bit group of said plural bits composed of continuing bit sequence is to be written into said first region; and
control means for controlling said rearranging means so that a second bit group of said plural bits composed of a continuing bit sequence and having a lower significance than that of respective bits of said first bit group is written into said first region and said first bit group is written into another one of said plurality of regions.

19. A memory device according to claim 18, wherein said rearranging means is a first rearranging means;
said memory device further comprising:
second rearranging means for rearranging said plural bits read out from said memory means;
wherein said control means includes means for controlling said second rearranging means so that the first and second bit groups read out from said memory means are returned to correct positions.

20. A memory device according to claim 18, wherein a second one of said plurality of regions includes a defective portion and a third bit group of said plural bits composed of a continuing bit sequence is to be written into said second region;
said control means includes means for controlling said rearranging means so that a fourth bit group having a lower significance than that of respective bits of said third bit group and composed of a continuing bit sequence is written into said second region and said third bit group is written into another one of said plurality of regions.

21. A memory device according to claims 18, 19 or 20, wherein said second bit group includes a LSB.

22. A memory device according to claim 19, wherein said first and second rearranging means are composed of a plurality of selectors.

23. A memory device according to claim 18, wherein said rearranging means includes a shift register for receiving said plural bits, and said control means for controlling said shift register to shift said second bit group for writing into said first region.

24. A memory device according to claims 18 or 19, wherein said control means has a memory section for storing information relating to said first region.

25. A memory device according to claim 20, wherein said control means has a memory section for storing information relating to said first and second regions.

26. A memory device according to claims 18, 19 or 20, wherein said plurality of regions are memory regions of one of a semiconductor memory, a hard disk, a floppy disk, a CD-RAM, a SD-RAM, a magneto-optical disk, a phase change rewrite-type disk or a magnetic tape.

27. A memory device for storing data composed of plural bits having different significances, comprising:
memory means having a plurality of portions divided into regions;
address means for providing address designating the portion of said memory means where said plural bits are to be stored;
rearranging means for rearranging said plural bits when a first one of said regions includes a defective potions and said address designates said defective portion for writing a first bit group of said plural bits composed of a continuing bit sequence; and
control means for controlling said rearranging means so that a second bit group of said plural bits composed of a continuing bit sequence having a lower significance than that of respective bits of said first bit group is written into said first region and said first bit group is written into another one of said regions.

28. A memory device according to claim 27, wherein said rearranging means is a first rearranging means;
said memory device further comprising:
second rearranging means for rearranging said plural bits read out from said memory means;
wherein said control means includes means for controlling said second rearranging means so that the first and second bits group read out from said memory means are returned to correct positions.

29. A memory device according to claim 27, wherein a second one of said regions includes a defective portion and said address designates said defective portion for writing a third bit group of said plural bits composed of a continuing bit sequence;

said control means includes means for controlling said
rearranging means so that a fourth bit group having a
lower significance than that of respective bits of said
third bit group and composed of a continuing bit
sequence is written into said second region and said
third bit group is written into another one of said
plurality of regions.

30. A memory device according to claims 27, 28 or 29, wherein said second bit group includes a LSB.

31. A memory device according to claim 28, wherein said first and second rearranging means are composed of a plurality of selectors.

32. A memory device according to claim 27, wherein said rearranging means includes a shift register for receiving said plural bits, and said control means for controlling said shift register to shift said second bit group for writing into said first region.

33. A memory device according to claims 27 or 28, wherein said control means includes a memory section for storing information regarding an error address designating said defective portion, and for storing information of said first region, and said control means includes means for controlling said rearranging means so that said second bit group is written in said first region, when the address designated by said address means agrees with the error address.

34. A memory device according to claims 27, 28 or 29, wherein said regions are memory regions of one of a semiconductor memory, a hard disk, a floppy disk, a CD-RAM, a SD-RAM, a magneto-optical disk, a phase change rewrite type disk or a magnetic tape.

35. An apparatus for use with a storage medium for storing data composed of plural bits having different significances, the storage medium having a plurality of regions a first region of which including a defective portion, comprising:

rearranging means for rearranging said plural bits when a first one of said plural bits is to be written into the first region; and control means for controlling said rearranging means so that a second of said plural bit having a lower significance than that of said first bit is written into the first region and the first bit is written into another one of the plurality of regions.

36. An apparatus according to claim 35, wherein said rearranging means is a first rearranging means; said apparatus further comprising:

second rearranging means for rearranging said plural bits read out from the storage medium;

wherein said control means includes means for controlling said second rearranging means so that the first and second bits read out from the storage medium are returned to correct positions.

37. An apparatus according to claim 35, wherein a second one of the plurality of regions of the storage medium includes a defective portion and a third of said plural bits is to be written into the second region;

said control means includes means for controlling said rearranging means so that a fourth of said plural bits with a lower significance than that of said third bit is written into the second region and said third bit is written into another one of the plurality of regions.

38. An apparatus according to claims 35, 36 or 37, wherein said second bit is a LSB (least significant bit).

39. An apparatus according to claim 36, wherein said first and second rearranging means are composed of a plurality of selectors.

40. An apparatus according to claim 35, wherein said rearranging means includes a shift register for receiving the plural bits, and said control means for controlling said shift register to shift said second bit for writing into the first region.

41. An apparatus according to claims 35 or 36, wherein said control means has a memory section for storing information relating to the first region.

42. An apparatus according to claim 37, wherein said control means has a memory section for storing information relating to the first and second regions.

43. An apparatus according to claims 35, 36 or 37, wherein said apparatus is for use with the storage medium provided as one of a semiconductor memory, a hard disk, a floppy disk, a CD-RAM, a SD-RAM, a magneto-optical disk, a phase change rewrite-type disk or a magnetic tape.

44. An apparatus for use with a storage medium for storing data composed of plural bits having different significances, the storage medium having a plurality of portions divided into regions a first region of which including a defective portion, comprising:

address means for providing an address designating the portion of the storage medium where said plural bits are to be stored;

rearranging means for rearranging said plural bits when the address designates the defective portion for writing a first of said plural bits; and control means for controlling said rearranging means so that a second of said plural bits having a lower significance than that of said first bit is written into the first region and said first bit is written into another one of the regions.

45. An apparatus according to claim 44, wherein said rearranging means is a first rearranging means;

said apparatus further comprising:

second rearranging means for rearranging said plural bits read out from the storage medium;

wherein said control means includes means for controlling said second rearranging means so that the first and second bits read out from the storage medium are returned to correct positions.

46. An apparatus according to claim 44, wherein a second one of the regions includes a defective portion and said address designates the defective portion for writing a third of said plural bits;

said control means includes means for controlling said rearranging means so that a fourth of said plural bits having a lower significance than that of said third bit is written into the second region and said third bit is written into another one of the plurality of regions.

47. An apparatus according to claims 44, 45 or 46, wherein said second bit is a LSB (least significant bit).

48. An apparatus according to claim 45, wherein said first and second rearranging means are composed of a plurality of selectors.

49. An apparatus according to claim 44, wherein said rearranging means includes a shift register for receiving said plural bits, and said control means for controlling said shift register to shift said second bit for writing into the first region.

50. An apparatus according to claims 44 or 45, wherein said control means includes a memory section for storing information regarding an error address designating the defective portion, and for storing information of the first region, and said control means includes means for controlling said rearranging means so that said second bit is written in the first region, when the address designated by said address means agrees with the error address.

51. An apparatus according to claims 44, 45 or 46, wherein the regions are memory regions of one of a semiconductor memory, a hard disk, a floppy disk, a CD-RAM, a SD-RAM, a magneto-optical disk, a phase change rewrite-type disk or a magnetic tape.

52. An apparatus for use with a storage medium for storing data composed of plural bits having different significances, the storage medium having a plurality of regions a first region of which including a defective portion, comprising:

rearranging means for rearranging said plural bits when a first bit group of said plural bits composed of continuing bit sequence is to be written into the first region; and control means for controlling said rearranging means so that a second bit group of said plural bits composed of a continuing bit sequence and having a lower significance than that of respective bits of said first bit group is written into the first region and said first bit group is written into another one of the plurality of regions.

53. An apparatus according to claim 52, wherein said rearranging means is a first rearranging means;

said apparatus further comprising:

second rearranging means for rearranging said plural bits read out from the storage medium;

wherein said control means includes means for controlling said second rearranging means so that the first and second bit groups read out from the storage medium are returned to correct positions.

54. An apparatus according to claim 52, wherein a second one of the plurality of regions includes a defective portion and a third bit group of said plural bits composed of a continuing bit sequence is to be written into the second region;

said control means includes means for controlling said rearranging means so that a fourth bit group having a lower significance than that of respective bits of said third bit group and composed of a continuing bit sequence is written into the second region and said third bit group is written into another one of the plurality of regions.

55. An apparatus according to claims 52, 53 or 54, wherein said second bit group includes a LSB.

56. An apparatus according to claim 53, wherein said first and second rearranging means are composed of a plurality of selectors.

57. An apparatus according to claim 52, wherein said rearranging means includes a shift register for receiving said plural bits, and said control means for controlling said shift register to shift said second bit group for writing into the first region.

58. An apparatus according to claims 52 or 53, wherein said control means has a memory section for storing information relating to the first region.

59. An apparatus according to claim 54, wherein said control means has a memory section for storing information relating to the first and second regions.

60. An apparatus according to claims 52, 53 or 54, wherein the plurality of regions are memory regions of one of a semiconductor memory, a hard disk, a floppy disk, a CD-RAM, a SD-RAM, a magneto-optical disk, a phase change rewrite-type disk or a magnetic tape.

61. An apparatus for use with a storage medium for storing data composed of plural bits having different significances, the storage medium having a plurality of portions divided into regions a first region of which including a defective portion, comprising:

address means for providing address designating the portion of the storage medium where said plural bits are to be stored;

rearranging means for rearranging said plural bits when said address designates the defective portion for writing a first bit group of said plural bits composed of a continuing bit sequence; and control means for controlling said rearranging means so that a second bit group of said plural bits composed of a continuing bit sequence having a lower significance than that of respective bits of said first bit group is written into the first region and said first bit group is written into another one of the regions.

62. An apparatus according to claim 61, wherein said rearranging means is a first rearranging means;

said apparatus further comprising:

second rearranging means for rearranging said plural bits read out from the storage medium;

wherein said control means includes means for controlling said second rearranging means so that the first and second bits group read out from the storage medium are returned to correct positions.

63. An apparatus according to claim 61, wherein a second one of the regions includes a defective portion and said address designates the defective portion for writing a third bit group of said plural bits composed of a continuing bit sequence;

said control means includes means for controlling said rearranging means so that a fourth bit group having a lower significance than that of respective bits of said third bit group and composed of a continuing bit sequence is written into the second region and said third bit group is written into another one of the plurality of regions.

64. An apparatus according to claims 61, 62 or 63, wherein said second bit group includes a LSB.

65. An apparatus according to claim 62, wherein said first and second rearranging means are composed of a plurality of selectors.

66. An apparatus according to claim 61, wherein said rearranging means includes a shift register for receiving said plural bits, and said control means for controlling said shift register to shift said second bit group for writing into the first region.

67. An apparatus according to claims 61 or 62, wherein said control means includes a memory section for storing information regarding an error address designating the defective portion, and for storing information of the first region, and said control means includes means for controlling said rearranging means so that said second bit group is written in the first region, when the address designated by said address means agrees with the error address.

68. An apparatus according to claims 61, 62 or 63, wherein the regions are memory regions of one of a semiconductor memory, a hard disk, a floppy disk, a CD-RAM, a SD-RAM, a magneto-optical disk, a phase change rewrite-type disk or a magnetic tape.

69. A method of reading and writing data to a storage medium having a plurality of regions, the data composed of plural bits having different significances, comprising steps of:

rearranging said plural bits when a first one of said regions includes a defective portion and a first one of said plural bits is to be written into said first region, so that a second one of said plural bits having a lower significance than that of said first bit is written into said first region and the first bit is written into another one of the plurality of regions; and rearranging said plural bits read out from the storage medium so that the first and second bits are returned to correct positions.

70. A method according to claim 69, wherein the step of rearranging said plural bits when a first region includes a defective portion includes a step of writing into said first region a LSB as the second bit.

71. A method of reading and writing data to a storage medium having a plurality of portions divided into regions, the data composed of plural bits having different significances, comprising steps of:

providing an address designating the portion in said storage medium, where said plural bits are to be written;

rearranging said plural bits when a first one of said regions includes a defective portion and said address designates the defective portion for writing a first one of said plural bits, so that a second one of said plural bits having a lower significance than that of said first bit is written into said first region and the first bit is written into another one of the plurality of regions; and rearranging said plural bits read out from the storage medium so that the first and second bits are returned to correct positions.

72. A method according to claim 71, wherein the step of rearranging said plural bits when a first region includes a defective portion includes a step of writing into said first region a LSB as the second bit.

73. A method of reading and writing data to a storage medium having a plurality of regions, the data composed of plural bits having different significances, comprising steps of:

rearranging said plural bits when a first one of said regions includes a defective portion and a first bit group of said plural bits composed of continuing bit sequence is to be written into said first region, so that a second bit group of said plural bits composed of continuing bit sequence having a lower significance than that of said first bit group is written into said first region and the first bit group is written into another one of the plurality of regions; and rearranging said plural bits read out from the storage medium so that the first and second bit groups are returned to correct positions.

74. A method according to claim 73, wherein the step of rearranging said plural bits when a first region includes a defective portion includes a step of writing into said first region a LSB as one bit of the second bit group.

75. A method of reading and writing data to a storage medium having a plurality of portions divided into regions, the data composed of plural bits having different significances, comprising steps of:

providing an address designating the portion in said storage medium, where said plural bits are to be written;

rearranging said plural bits when a first one of said regions includes a defective portion and said address designates the defective portion for writing a first bit group of said plural bits composed of continuing bit sequence, so that a second bit group of said plural bits composed of continuing bit sequence having a lower significance than that of said first bit group is written into said first region and the first bit group is written into another one of the plurality of regions; and rearranging said plural bits read out from the storage medium so that the first and second bit groups are returned to correct positions.

76. A method according to claim 75, wherein the step of rearranging said plural bits when a first region includes a defective portion includes a step of writing into said first region a LSB as one of the second bit group.

77. An apparatus for reading plural bits of data from a storage medium, the plural bits having a predetermined sequence and different significances and being stored in the storage medium in a rearranging sequence, so that at least one bit of greater significance is stored in a non-defective portion of the storage medium and at least one bit of lesser significance is stored in a defective portion of the storage medium, comprising:

means for reading out the plural bits from the storage medium having the defective portion; and means for rearranging the plural bits to the predetermined sequence the bits had prior to storage in the storage medium having the defective portion.

78. A method of reading plural bits of data from a storage medium, the plural bits having a predetermined sequence and different significances and being stored in the storage medium in a rearranging sequence, so that at least one bit of greater significance is stored in a non-defective portion of the storage medium and at least one bit of lesser significance is stored in a defective portion of the storage medium, comprising the steps of:

reading out the plural bits from the storage medium having the defective portion; and rearranging the plural bits to the predetermined sequence the bits had prior to storage in the storage medium having the defective portion.

* * * * *